(12) United States Patent
Tanno et al.

(10) Patent No.: US 11,333,973 B2
(45) Date of Patent: May 17, 2022

(54) RESIST COMPOSITION AND METHOD OF FORMING RESIST PATTERN

(71) Applicant: TOKYO OHKA KOGYO CO., LTD., Kawasaki (JP)

(72) Inventors: Kazuishi Tanno, Kawasaki (JP); Tsuyoshi Nakamura, Kawasaki (JP); Eun Sol Jo, Incheon (KR)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 572 days.

(21) Appl. No.: 16/299,770

(22) Filed: Mar. 12, 2019

(65) Prior Publication Data

US 2019/0285984 A1    Sep. 19, 2019

(30) Foreign Application Priority Data

Mar. 16, 2018    (KR) .................. 10-2018-0031141

(51) Int. Cl.
*G03F 7/004*    (2006.01)
*G03F 7/039*    (2006.01)
(Continued)

(52) U.S. Cl.
CPC .......... *G03F 7/0045* (2013.01); *C08F 220/16* (2013.01); *C08F 220/1809* (2020.02);
(Continued)

(58) Field of Classification Search
CPC ...... C08F 20/16; C08F 20/18; C08F 20/1805; C08F 20/28; C08F 20/281; C08F 20/30; C08F 12/34
See application file for complete search history.

(56) References Cited

U.S. PATENT DOCUMENTS 9,366,958 B2 *    6/2016    Ohashi ............... G03F 7/0046
9,523,912 B2 *    12/2016    Kataoka ............. C07D 411/06
(Continued)

FOREIGN PATENT DOCUMENTS

JP        2014-194534 A        10/2014
WO    WO 2014/133187 A1    9/2014

*Primary Examiner* — Amanda C. Walke
(74) *Attorney, Agent, or Firm* — Knobbe Martens Olson & Bear LLP

(57) ABSTRACT

A resist composition including a base component which exhibits changed solubility in a developing solution under action of acid and an acid-generator component (B) which generates acid upon exposure, the base component including a polymeric compound containing a structural unit having an acid decomposable group, the amount of the structural unit having an acid decomposable group, based on the combined total of all structural units contained in the base component being 51 mol % to 59 mol %, and the structural unit having an acid decomposable group includes a structural unit represented by general formula (a1-1) shown below (in which R represents a hydrogen atom, an alkyl group or a halogenated alkyl group; Z represents a single bond or an alkyl group; and $C_p$ is a group represented by general formula (Cp-1) shown below).

(a1-1)

(Continued)

(A)    (B)    (C)

-continued

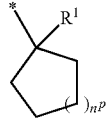

(Cp-1)

9 Claims, 3 Drawing Sheets

(51) Int. Cl.
| | | |
|---|---|---|
| G03F 7/038 | (2006.01) | |
| G03F 7/16 | (2006.01) | |
| G03F 7/20 | (2006.01) | |
| G03F 7/38 | (2006.01) | |
| G03F 7/32 | (2006.01) | |
| C08F 220/16 | (2006.01) | |
| C08F 220/28 | (2006.01) | |
| C08F 220/18 | (2006.01) | |

(52) U.S. Cl.
CPC .......... *C08F 220/283* (2020.02); *G03F 7/038* (2013.01); *G03F 7/039* (2013.01); *G03F 7/162* (2013.01); *G03F 7/168* (2013.01); *G03F 7/2006* (2013.01); *G03F 7/2041* (2013.01); *G03F 7/327* (2013.01); *G03F 7/38* (2013.01); *C08F 220/281* (2020.02)

(56) References Cited

U.S. PATENT DOCUMENTS

| | | | | |
|---|---|---|---|---|
| 9,658,532 | B2 * | 5/2017 | Hatakeyama | B05D 3/0453 |
| 9,696,625 | B2 * | 7/2017 | Hirano | C08F 26/06 |
| 11,099,479 | B2 * | 8/2021 | Nagamine | G03F 7/0397 |
| 2016/0313645 | A1 * | 10/2016 | Kato | G03F 7/2035 |

* cited by examiner (A)  (B)  (C)

(A)  (B)  (C)

RESIST COMPOSITION AND METHOD OF FORMING RESIST PATTERN

TECHNICAL FIELD

The present invention relates to a resist composition and a method of forming a resist pattern.

Priority is claimed on Korean Patent Application No. 10-2018-0031141, filed Mar. 16, 2018, the content of which is incorporated herein by reference.

DESCRIPTION OF RELATED ART

Techniques (pattern-forming techniques) in which a fine pattern is formed on top of a substrate, and a lower layer beneath that pattern is then fabricated by conducting etching with this pattern as a mask are widely used in the production of semiconductor devices and liquid display device. These types of fine patterns are usually formed from an organic material, and are formed using a lithography method or a nanoimprint method or the like. For example, in a lithography method, a resist film is formed on a support such as a substrate using a resist material containing a base component such as a resin; the resist film is selectively exposed using an ArF exposure apparatus, an electron beam lithography apparatus, an EUV exposure apparatus or the like; and developing treatment is conducted to form a resist pattern having a predetermined shape on the resist film. Further, using the resist pattern as a mask, the substrate is processed by etching, so as to produce a semiconductor or the like.

The resist material is classified into a positive-type and a negative-type. A resist material in which the exposed portions exhibits increased solubility in a developing solution is called a positive-type. On the other hand, a resist material in which the exposed portions exhibit decreased solubility in a developing solution is called a negative-type.

In general, an aqueous alkali solution (alkali developing solution) such as an aqueous solution of tetramethylammonium hydroxide (TMAH) is used as the developing solution. Alternatively, an organic solvent such as an aromatic solvent, an aliphatic hydrocarbon solvent, an ether solvent, a ketone solvent, an ester solvent, an amide solvent or an alcohol solvent is used as the developing solution.

In recent years, advances in lithography techniques have led to progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

As the wavelength of the exposure source becomes shorter, resist materials are required to have lithography properties such as a high resolution capable of reproducing patterns of minute dimensions, and a high level of sensitivity to these types of exposure light sources. As resist materials which satisfy such requirements, chemically amplified resists are known.

As a chemically amplified composition, a composition including a base material component that exhibits a changed solubility in a developing solution under the action of acid and an acid-generator component that generates acid upon exposure is generally used. For example, in the case where an alkali developing solution is used as a developing solution (alkali developing process), a base component which exhibits increased solubility in an alkali developing solution under action of acid is used.

Conventionally, a resin (base resin) is typically used as the base component of a chemically amplified resist composition. Currently, resins that contain structural units derived from (meth)acrylate esters within the main chain (acrylic resins) are now widely used as base resins for chemically amplified resist compositions that use ArF excimer laser lithography, as they exhibit excellent transparency in the vicinity of 193 nm In general, the base resin for a chemically amplified resist composition contains a plurality of kinds of structural units for improving lithography properties and the like. When the base resin is an acrylic resin, as the acid decomposable group, in general, resins in which the carboxy group of (meth)acrylic acid or the like is protected with an acid dissociable group such as a tertiary alkyl group or an acetal group are used.

For example, referring to Patent Literature 1, it is disclosed that a resin contained in a resist composition may have an acid decomposable group which is a polar group protected with a group decomposable by the action of acid.

However, not only in the formation of a minute pattern for increasing the degree of integration of an integrated circuit chip, in the formation of a minute pattern, it is important to uniformly miniaturize a resist pattern. In this regard, critical dimension (CD) refers to the dimension (width of an interconnect line, contact, trench or the like) of the smallest geometrical feature in the formation of a semiconductor device. For forming a uniform resist pattern, it is required to effectively control the deviation of CD.

DOCUMENTS OF RELATED ART

Patent Literature

[Patent Document 1] Japanese Unexamined Patent Application, First Publication No. 2014-194534

SUMMARY OF THE INVENTION

The present invention takes the above circumstances into consideration, with an object of providing a resist composition capable of forming a resist pattern in which critical dimension uniformity (CDU) is improved in the formation of a contact hole (CH); and a method of forming a resist pattern using the resist composition.

Another object of the present invention is to provide a resist composition which may be used in either negative-tone development or positive-tone development without any problems.

As a result of the studies of the present inventors, they have found that the above problems may be solved when a resist composition contains a polymer containing a specific acid decomposable group in a specific amount. The present invention has been completed based on this finding.

A first aspect of the present invention is a resist composition including a base component (A) which exhibits changed solubility in a developing solution under action of acid and an acid-generator component (B) which generates acid upon exposure, the base component (A) including a polymeric compound containing a structural unit (a1) having an acid decomposable group, the amount of the structural unit (a1) having an acid decomposable group, based on the combined total of all structural units contained in the component (A) being 51 mol % to 59 mol %, and the structural unit (a1) having an acid decomposable group includes a structural unit represented by general formula (a1-1) shown below.

[Chemical Formula 1]

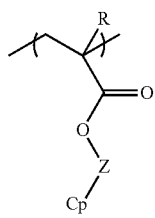

(a1-1)

In formula (a1-1), R represents a hydrogen atom, an alkyl group or a halogenated alkyl group; Z represents a single bond or an alkyl group; and $C_p$ is a group represented by general formula (Cp-1) shown below:

[Chemical Formula 2]

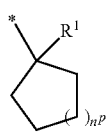

(Cp-1)

In the formula, $R^1$ represents a tertiary alkyl group; $n_p$ represents a positive integer; and * indicates the bonding position with Z.

A second aspect of the present invention is a method of forming a resist pattern, including: using a resist composition according to the first aspect to form a resist film on a substrate, exposing the resist film, and developing the resist film to form a resist pattern.

According to the present invention, there are provided a resist composition capable of forming a resist pattern in which CDU properties are improved in the formation of CH.

DETAILED DESCRIPTION OF THE INVENTION

Figure 1:
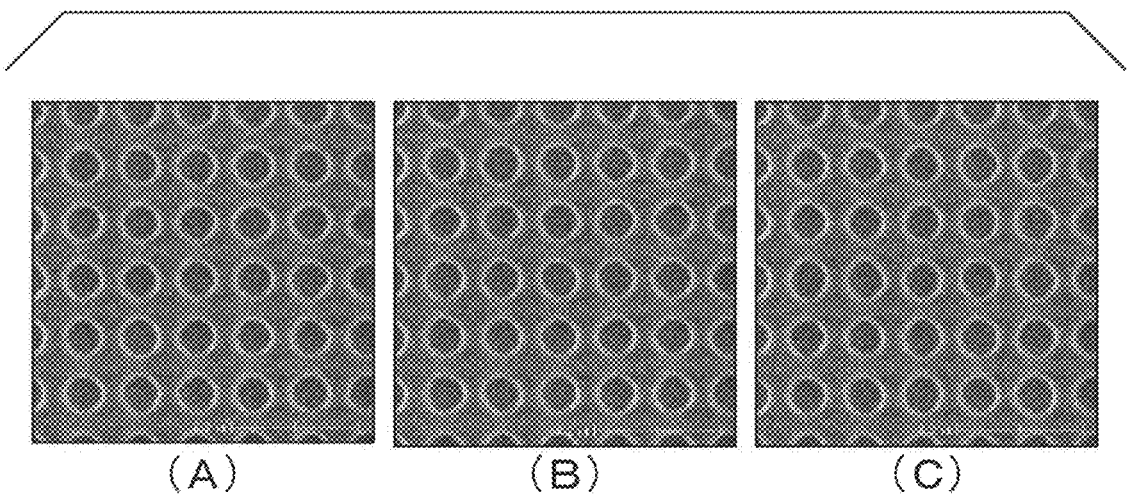
FIG. 1 (A) to (C) are SEM photomicrographs of Comparative Example 1, Example 1 and Comparative Example 2, respectively.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent ($R^α$) with which the hydrogen atom bonded to the carbon atom at the α-position is substituted is an atom other than the hydrogen atom or a group, and examples thereof include an alkyl group having from 1 to 5 carbon atoms, a halogenated alkyl group having from 1 to 5 carbon atoms, and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

A "styrene derivative" refers to a compound in which the hydrogen atom on the α-position of styrene is substituted with a substituent such as an alkyl group, a halogenated alkyl group or the like.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The expression "may have a substituent" means that a case where a hydrogen atom (—H) is substituted with a monovalent group, or a case where a methylene (—CH$_2$—) group is substituted with a divalent group.

The term "exposure" is used as a general concept that includes irradiation with any form of radiation.

<Resist Composition>

A first aspect of the present invention is a resist composition including a base component (A) which exhibits changed solubility in a developing solution under action of acid and an acid-generator component (B) which generates acid upon exposure, the base component (A) including a polymeric compound containing a structural unit (a1) having an acid decomposable group, the amount of the structural unit (a1) having an acid decomposable group, based on the combined total of all structural units contained in the component (A) being 51 mol % to 59 mol %, and the structural unit (a1) having an acid decomposable group includes a structural unit represented by general formula (a1-1) shown below.

[Chemical Formula 3]

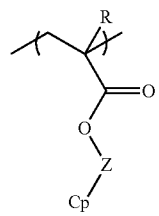

(a1-1)

In formula (a1-1), R represents a hydrogen atom, an alkyl group or a halogenated alkyl group; Z represents a single bond or an alkyl group; and $C_p$ is a group represented by general formula (Cp-1) shown below:

[Chemical Formula 4]

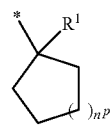

(Cp-1)

In the formula, $R^1$ represents a tertiary alkyl group; $n_p$ represents a positive integer; and * indicates the bonding position with Z.

In formula (a1-1), as the alkyl group or halogenated alkyl group for R, an alkyl group having 1 to 5 carbon atoms or a halogenated alkyl group having 1 to 5 carbon atoms is preferable.

In the present embodiment, the resist composition contains a base component (A) (hereafter, referred to as "base component (A)") which exhibits changed solubility in a developing solution.

When a resist film is formed using the resist composition and the formed resist film is subjected to a selective exposure, acid is generated at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions of the resist film are dissolved and removed to form a positive-tone resist pattern in the case of a positive resist, whereas the unexposed portions of the resist film are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

In the present embodiment, the resist composition may be either a positive resist composition or a negative resist composition. The resist composition of the present embodiment may be used in a dual tone developing (DTD) process.

In the formation of a resist pattern, the resist composition of the present embodiment may be applied to an alkali developing process using an alkali developing solution in the developing treatment, or a solvent developing process using a developing solution containing an organic solvent (organic developing solution) in the developing treatment. The resist composition of the present embodiment is preferably applied to a solvent developing process.

The resist composition usable in forming a resist pattern has a function of generating acid upon exposure. The resist composition contains an acid-generator component (B), and the component (A) may be capable of generating acid upon exposure.

In the case where the component (A) generates acid upon exposure, the component (A) is a "base component which generates acid upon exposure and exhibits changed solubility in a developing solution under action of acid". In the case where the component (A) is a base component which generates acid upon exposure and exhibits changed solubility in a developing solution under action of acid, the component (A1) described later is preferably a polymeric compound which generates acid upon exposure and exhibits changed solubility in a developing solution under action of acid. As the polymeric compound, a resin having a structural unit which generates acid upon exposure can be used. As the structural unit which generates acid upon exposure, a conventional structural unit can be used.

<Component (A)>

In the present invention, the term "base component" refers to an organic compound capable of forming a film, and is preferably an organic compound having a molecular weight of 500 or more. When the organic compound has a molecular weight of 500 or more, the film-forming ability is improved, and a resist pattern of nano level may be reliably formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" refers to a polymer (polymeric compound) having a molecular weight of 1,000 or more.

As the molecular weight of the polymer, the weight average molecular weight in terms of the polystyrene equivalent value determined by gel permeation chromatography (GPC) is used.

As the component (A'), a resin, a low molecular weight compound, or a combination thereof may be used.

The component (A) is a base component which exhibits changed solubility in a developing solution under action of acid.

In the present embodiment, the component (A) may be a component that generates acid upon exposure.

In the present embodiment, the component (A) includes a polymeric compound (A1) having a structural unit which contains an acid decomposable group that exhibits increased polarity by action of acid (hereafter, sometimes referred to as "structural unit (a1)"). In the present embodiment, the polymeric compound (A1) preferably contains a structural unit having an —$SO_2$-containing cyclic group, a lactone-containing cyclic group, a carbonate-containing cyclic group or any other heterocyclic group (hereafter, referred to as "structural unit (a2)"), and a structural unit containing a polar group-containing aliphatic hydrocarbon group (hereafter, referred to as "structural unit (a3)"). The polymeric compound (A1) may also include a structural unit (a4) which is other than the above-mentioned structural units (a1), (a2) and (a3).

In the present embodiment, the amount (mol %) of the structural unit (a1) having an acid decomposable group, based on the combined total of all structural units contained in the polymeric compound (A1) is defined as "protection ratio". In the present embodiment, the protection ratio is preferably 51 mol % to 59 mol %, more preferably 52 mol % to 56 mol %, and still more preferably 52.5 mol % to 55 mol %. When the protection ratio is within the above-mentioned range, various lithography properties such as CDU, sensitivity, resolution and LWR may be improved.

(Structural Unit (a1))

The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—$SO_3H$). Among these examples, a sulfo group or a polar group containing —OH in the structure thereof (hereafter, sometimes referred to as "OH-containing polar group") is preferable, a sulfo group, a carboxy group or a hydroxy group is more preferable, and a carboxy group is most preferable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

Here, the "acid dissociable group" includes:
(i) a group in which the bond between the acid dissociable group and the adjacent atom is cleaved by the action of acid; and
(ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire polymeric compound (A1) is increased. By the increase in the polarity, the solubility in an alkali developing solution changes and, the solubility in an organic developing solution is relatively decreased.

The acid dissociable group is not particularly limited, and any of the groups that have been conventionally proposed as acid dissociable groups for the base resins of chemically amplified resists may be used.

Examples of the acid dissociable group for protecting the carboxy group or hydroxy group as a polar group include an acid dissociable group represented by general formula (a1-r-1) shown below (hereafter, referred to as "acetal-type acid dissociable group").

[Chemical Formula 5]

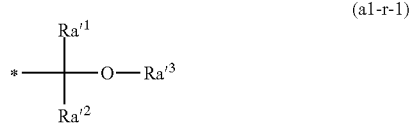

(a1-r-1)

In the formula, $Ra'^1$ and $Ra'^2$ represents a hydrogen atom or an alkyl group; and $Ra'^3$ represents a hydrocarbon group, provided that $Ra'^3$ may be bonded to $Ra'^1$ or $Ra'^2$; and * indicates the bonding position.

In formula (a1-r-1), as the lower alkyl group for $Ra'^1$ and $Ra'^2$, the same lower alkyl groups as those described above the alkyl groups as the substituent which may be bonded to the carbon atom on the α-position of the aforementioned α-substituted alkylester can be used, although a methyl group or ethyl group is preferable, and a methyl group is particularly desirable.

The hydrocarbon group for $Ra'^3$ is preferably an alkyl group of 1 to 20 carbon atoms, more preferably an alkyl group of 1 to 10 carbon atoms, and still more preferably a linear or branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group and a 2,2-dimethylbutyl group.

In the case where $Ra'^3$ represents a cyclic hydrocarbon group, the cyclic hydrocarbon group may be aliphatic or aromatic, and may be polycyclic or monocyclic. As the monocyclic aliphatic hydrocarbon group, a group in which 1 hydrogen atom has been removed from a monocycloalkane is preferable. The monocycloalkane preferably has 3 to 8 carbon atoms, and specific examples thereof include cyclopentane, cyclohexane and cyclooctane. As the polycyclic group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

In the case of an aromatic hydrocarbon group, specific examples of the aromatic ring contained in the aromatic hydrocarbon group include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which one hydrogen atom has been removed from the aforementioned aromatic hydrocarbon ring (aryl group); and a group in which one hydrogen atom of the above aryl group has been substituted with an alkylene group (e.g., an arylalkyl group such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below.

[Chemical Formula 6]

(a1-r-2)

In the formula, $Ra'^4$ to $Ra'^6$ each independently represents a hydrocarbon group, provided that $Ra'^5$ and $Ra'^6$ may be mutually bonded to form a ring; and * indicates the bonding position.

As the hydrocarbon group for $Ra'^4$ to $Ra'^6$, the same groups as those described above for $Ra'^3$ can be mentioned. $Ra'^4$ is preferably an alkyl group having from 1 to 5 carbon atoms. In the case where $Ra'^5$ and $Ra'^6$ are mutually bonded to form a ring, a group represented by general formula (a1-r2-1) shown below can be mentioned. On the other hand, in the case where $Ra'^4$ to $Ra'^6$ are not mutually bonded and independently represent a hydrocarbon group, the group represented by general formula (a1-r2-2) shown below can be mentioned.

[Chemical Formula 7]

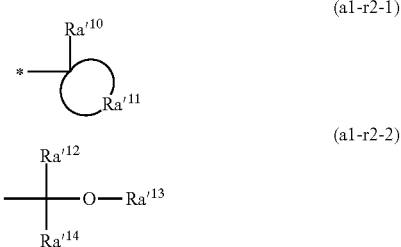

(a1-r2-1)

(a1-r2-2)

In the formulae, $Ra'^{10}$ represents an alkyl group of 1 to 10 carbon atoms; $Ra'^{11}$ is a group which forms an aliphatic cyclic group together with a carbon atom having $Ra'^{10}$ bonded thereto; and $Ra'^{12}$ to $Ra'^{14}$ each independently represents a hydrocarbon group; and * indicates the bonding position.

In the formula (a1-r2-1), as the alkyl group of 1 to 10 carbon atoms for $Ra'^{10}$, the same groups as described above for the linear or branched alkyl group for $Ra'^3$ in the formula (a1-r-1) are preferable. In the formula (a1-r2-1), as the aliphatic cyclic group which is formed by $Ra'^{11}$, the same groups as those described above for the cyclic alkyl group for $Ra'^3$ in the formula (a1-r-1) are preferable.

In the formula (a1-r2-2), it is preferable that $Ra'^{12}$ and $Ra'^{14}$ each independently represents an alkyl group or 1 to 10 carbon atoms, and it is more preferable that the alkyl group is the same group as the described above for the linear or branched alkyl group for $Ra'^3$ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r2-2), it is preferable that $Ra'^{13}$ is the same group as described above for the linear, branched or cyclic alkyl group for Ra$^{t3}$ in the formula (a1-r-1). Among these, the same cyclic alkyl group as those describe above for Ra$^{t3}$ is more preferable.

Specific examples of the formula (a1-r2-1) are shown below. In the formulae shown below, "*" indicates the bonding position.

[Chemical Formula 8]

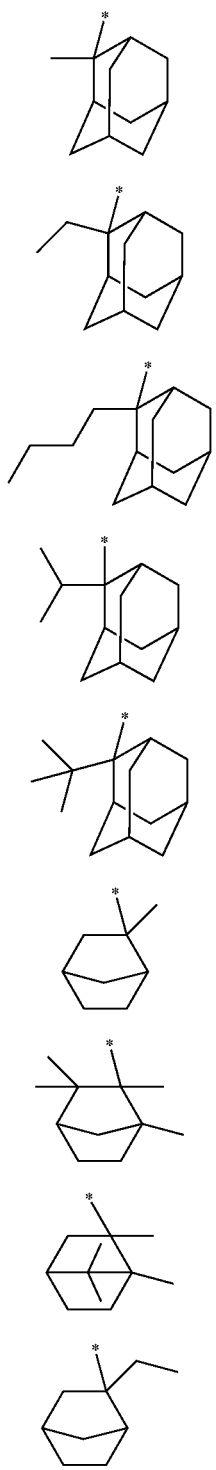

(r-pr-m1)

(r-pr-m2)

(r-pr-m3)

(r-pr-m4)

(r-pr-m5)

(r-pr-m6)

(r-pr-m7)

(r-pr-m8)

(r-pr-m9)

-continued

(r-pr-m10)

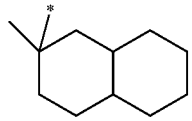

(r-pr-m11)

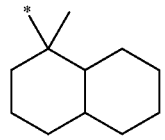

(r-pr-m12)

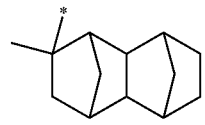

(r-pr-m13)

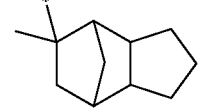

(r-pr-m14)

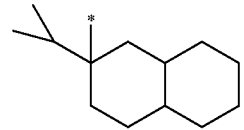

(r-pr-m15)

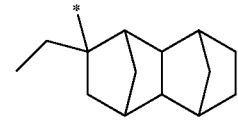

(r-pr-m16)

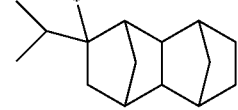

(r-pr-m17)

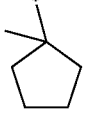

(r-pr-s1)

(r-pr-s2)

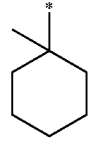

(r-pr-s3)

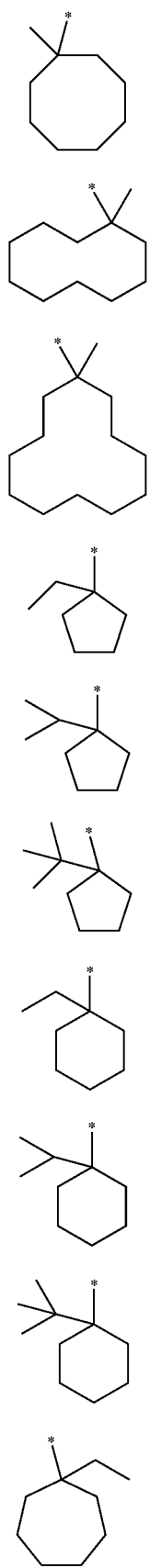
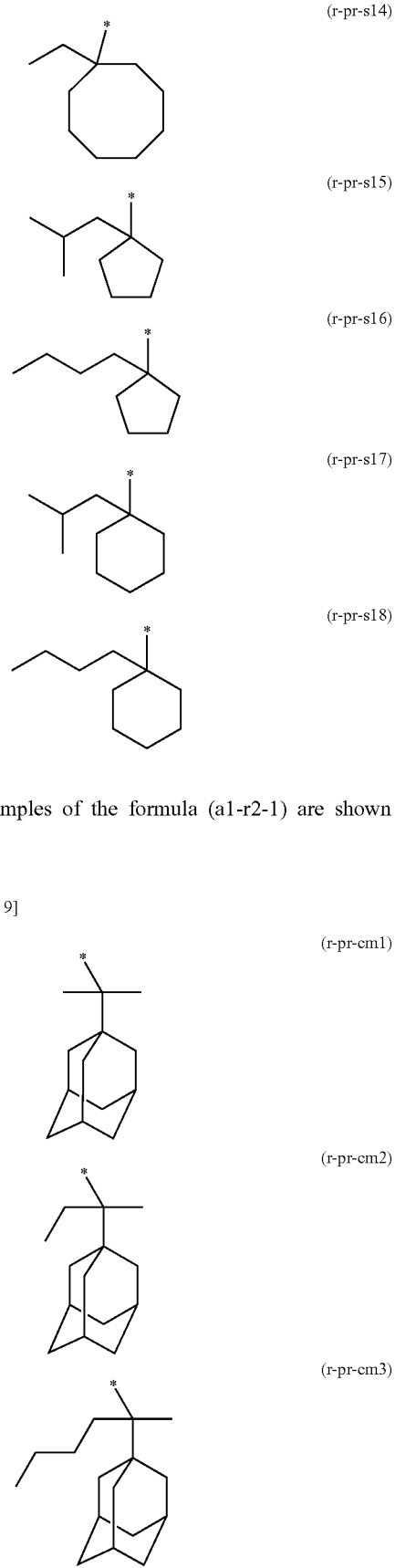
Specific examples of the formula (a1-r2-1) are shown below.
[Chemical Formula 9]

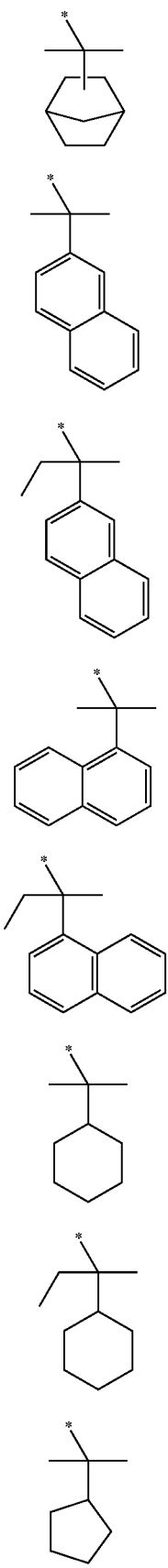

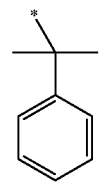
(r-pr-cs4)

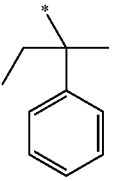
(r-pr-cs5)

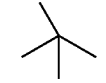
(r-pr-c1)

(r-pr-c2)

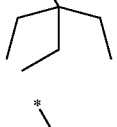
(r-pr-c3)

(r-pr-c4)

Examples of the acid dissociable group for protecting a hydroxy group as a polar group include the acid dissociable group represented by general formula (a1-r-3) shown below (hereafter, referred to as "tertiary alkyloxycarbonyl-type acid dissociable group").

[Chemical Formula 10]

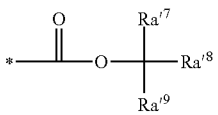
(a1-r-3)

In the formula, $Ra'^7$ to $Ra'^9$ each independently represents an alkyl group; and * indicates the bonding position.

In the formula (a1-r-3), $Ra'^7$ to $Ra'^9$ is preferably an alkyl group of 1 to 5 carbon atoms, and more preferably an alkyl group of 1 to 3 carbon atoms.

Further, the total number of carbon atoms within the alkyl group is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group.

As the structural unit (a1), it is preferable to include a structural unit represented by general formula (a1-1) shown below.

[Chemical Formula 11]

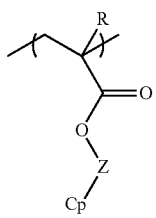

(a1-1)

In formula (a1-1), R represents a hydrogen atom, an alkyl group or a halogenated alkyl group; Z represents a single bond or an alkyl group; and $C_p$ is a group represented by general formula (Cp-1) shown below:

[Chemical Formula 12]

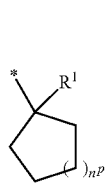

(Cp-1)

In the formula, $R^1$ represents a tertiary alkyl group; $n_p$ represents a positive integer; and * indicates the bonding position with Z.

In formula (a1-1), the alkyl group is preferably an alkyl group of 1 to 5 carbon atoms, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom or a methyl group is particularly desirable in terms of industrial availability.

In formula (Cp-1), $n^p$ is preferably an integer of 1 to 3, and more preferably 1. $R^1$ is preferably a tertiary alkyl group having 4 to 10 carbon atoms, and more preferably a tert-butyl group.

Z is preferably a single bond or an alkylene group having 1 to 10 carbon atoms. The alkylene group having 1 to 10 carbon atoms is preferably a linear or branched alkylene group having 1 to 10 carbon atoms, more preferably a linear or branched alkylene group having 1 to 5 carbon atoms, and specific examples include a methylene group, an ethylene group, a propylene group, an isopropylene group and an n-butylene group.

As Z, a single bond or an alkylene group having 1 to 5 carbon atoms is preferable, and a single bond is most preferable.

Specific examples of the formula (a1-1) are shown below. In the formulae shown below, R represents a hydrogen atom, a methyl group or a trifluoromethyl group.

[Chemical Formula 13]

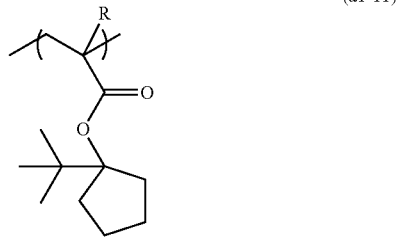

(a1-11)

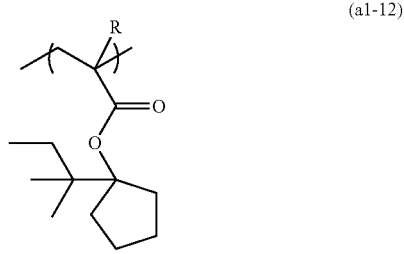

(a1-12)

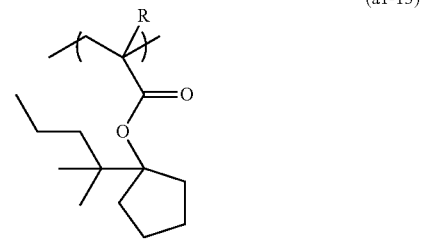

(a1-13)

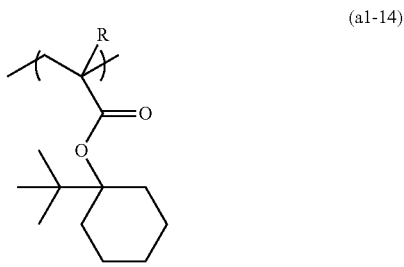

(a1-14)

In the present embodiment, the polymeric compound (A1) containing a structural unit (a1) may further contain a structural unit having an acid decomposable group other than the structural unit represented by formula (a1-1). As the structural unit having an acid decomposable group other than the structural unit represented by formula (a1-1), a conventional structural unit may be used, but is preferably a structural unit represented by formula (a1-2) shown below.

[Chemical Formula 14]

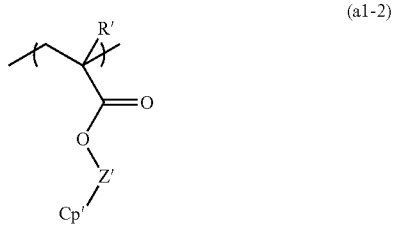

(a1-2)

In formula (a1-2), R' represents a hydrogen atom, an alkyl group or a halogenated alkyl group; Z' represents a single bond or an alkyl group; $C_p'$ is a group represented by the aforementioned formula (a1-r-1) or (a1-r-2).

In formula (a1-2), R' and Z' are the same as defined for R and Z in the aforementioned formula (a-1), respectively.

In the present embodiment, the polymeric compound (A1) containing a structural unit (a1) may further contain, as a structural unit having an acid decomposable group other than the structural unit represented by formula (a1-1), a structural unit represented by formula (a1-3) or (a1-4) shown below.

[Chemical Formula 15]

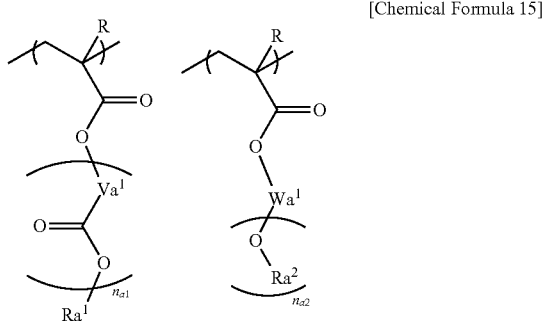

In the formula, R is the same as defined above; $Va^1$ represents a divalent hydrocarbon group which may contain an ether bond, an urethane bond or an amide bond; each $n_{a1}$ represents an integer of 0 to 2; $Ra^1$ represents an acid dissociable group represented by the aforementioned formula (a1-r-1) or (a1-r-2); $Wa^1$ represents a hydrocarbon group having a valency of $n_{a2}+1$; $n_{a2}$ represents an integer of 1 to 3; and $Ra^2$ represents an acid dissociable group represented by the aforementioned formula (a1-r-1) or (a1-r-3).

The hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, as the group for $Va^1$, a group in which the aforementioned divalent hydrocarbon group has been bonded via an ether bond, urethane bond or amide bond can be mentioned.

The linear or branched aliphatic hydrocarbon group for $Va^1$ preferably has 1 to 10 carbon atoms, more preferably 1 to 6, carbon atoms still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

Examples of the aliphatic hydrocarbon group containing a ring in the structure thereof represented by $Va^1$ include an alicyclic hydrocarbon group (a group in which two hydrogen atom has been removed from an aliphatic hydrocarbon ring); a group in which an alicyclic hydrocarbon group is bonded to a terminal of a linear or branched aliphatic hydrocarbon group; and a group in which an alicyclic hydrocarbon group is present between carbon atoms of a linear or branched aliphatic hydrocarbon group. The linear or branched aliphatic hydrocarbon group is the same as defined above.

The alicyclic hydrocarbon group preferably has 3 to 20 carbon atoms, and more preferably 3 to 12 carbon atoms.

The alicyclic hydrocarbon group for $Va^1$ may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for $Va^1$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Specific examples of the aromatic ring contained in the aromatic hydrocarbon group for $Va^1$ include aromatic hydrocarbon rings such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group represented by $Va^1$ include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

In the aforementioned formula (a1-4), the hydrocarbon group for $Wa^1$ having a valency of $n_{a2}+1$ may be either an aliphatic hydrocarbon group or an aromatic hydrocarbon group. The aliphatic cyclic group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for $Va^1$ in the aforementioned formula (a1-3) can be mentioned.

Regarding $Wa^1$, the valency of $n_{a2}+1$ is preferably divalent, trivalent or tetravalent, and divalent or trivalent is more preferable.

In the present embodiment, the protection ratio refers to the mol % of the structural unit (a1), based on the combined total of all structural units contained in the polymeric compound (A1). In the present embodiment, the mol % (protection ratio) of the structural unit (a1) having an acid decomposable group, based on the combined total of all structural units contained in the polymeric compound (A1) is preferably 51 mol % to 59 mol %, more preferably 52 mol % to 56 mol %, and still more preferably 52.5 mol % to 55 mol %.

In the present embodiment, when the protection ratio of the specific acid decomposable group is within the above-mentioned range, the CUD properties are improved in the formation of a contact hole.

(Structural Unit (a2))

In the present embodiment, the base component may include a structural unit (a2) having an $—SO_2—$ containing cyclic group, a lactone-containing cyclic group, a carbonate-containing cyclic group or any other heterocyclic group.

When the component (A) is used for forming a resist film, the structural unit (a2) containing an $—SO_2—$ containing cyclic group, a lactone-containing cyclic group, a carbonate-containing cyclic group or any other heterocyclic group is effective in improving the adhesion between the resist film and the substrate.

The aforementioned structural unit (a1) which contains an $—SO_2—$ containing cyclic group, a lactone-containing cyclic group, a carbonate-containing cyclic group or any other heterocyclic group falls under the definition of the structural unit (a2); however, such a structural unit is regarded as a structural unit (a1), and does not fall under the definition of the structural unit (a2).

The structural unit (a2) is preferably a structural unit represented by general formula (a2-1) shown below.

[Chemical Formula 16]

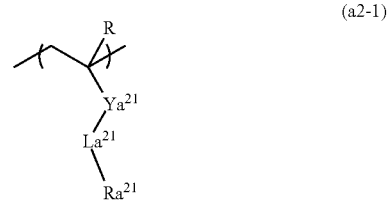

(a2-1)

In the formula, R represents a hydrogen atom, an alkyl group, a halogenated alkyl group, a hydroxyalkyl group, an alkoxy group; $Ya^{21}$ represents a single bond or a divalent linking group; $La^{21}$ represents $—O—$, $—COO—$, $—CON(R')—$, $—OCO—$, $—CONHCO—$ or $—CONHCS—$; and R' represents a hydrogen atom or a methyl group, provided that, when $La^{21}$ represents $—O—$, $Ya^{21}$ does not represent $—CO—$; and $Ra^{21}$ represents an $—SO_2—$ containing cyclic group, a lactone-containing cyclic group, a carbonate-containing cyclic group or any other heterocyclic group.

In formula (a2-1), as the alkyl group or halogenated alkyl group for R, an alkyl group having 1 to 5 carbon atoms or a halogenated alkyl group having 1 to 5 carbon atoms is preferable.

In formula (a2-1), $Ra^{21}$ is preferably an $—SO_2—$ containing cyclic group, a lactone-containing cyclic group, a heterocyclic group or a carbonate-containing cyclic group.

An "$—SO_2—$ containing cyclic group" refers to a cyclic group having a ring containing $—SO_2—$ within the ring structure thereof, i.e., a cyclic group in which the sulfur atom (S) within $—SO_2—$ forms part of the ring skeleton of the cyclic group. The ring containing $—SO_2—$ within the ring skeleton thereof is counted as the first ring. A cyclic group in which the only ring structure is the ring that contains $—SO_2—$ in the ring skeleton thereof is referred to as a monocyclic group, and a group containing other ring structures is described as a polycyclic group regardless of the structure of the other rings. The $—SO_2$-containing cyclic group may be either a monocyclic group or a polycyclic group.

As the $—SO_2—$ containing cyclic group, a cyclic group containing $—O—SO_2—$ within the ring skeleton thereof, i.e., a cyclic group containing a sultone ring in which $—O—S—$ within the $—O—SO_2—$ group forms part of the ring skeleton thereof is particularly desirable. More specific examples of the $—SO_2—$ containing cyclic group include groups represented by general formulas (a5-r-1) to (a5-r-4) shown below.

[Chemical Formula 17]

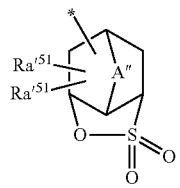

(a5-r-1)

-continued (a5-r-2)

(a5-r-3)

(a5-r-4)

In the formulae, each $Ra'^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and n' represents an integer of 0 to 2.

In general formulae (a5-r-1) to (a5-r-4), A" is the same as defined for A" in general formulae (a2-r-1) to (a2-r-7) described later. The alkyl group, alkoxy group, halogen atom, halogenated alkyl group, —COOR", —OC(=O)R" and hydroxyalkyl group for $Ra'^{51}$ are the same as defined for $Ra'^{21}$ in general formulae (a2-r-1) to (a2-r-7) described later.

Specific examples of the groups represented by the aforementioned general formulae (a5-r-1) to (a5-r-4) are shown below. In the formulae shown below, "Ac" represents an acetyl group.

[Chemical Formula 18]

(r-sl-1-1)

(r-sl-1-2)

(r-sl-1-3)

(r-sl-1-4)

(r-sl-1-5)

(r-sl-1-6)

(r-sl-1-7)

(r-sl-1-8)

(r-sl-1-9)

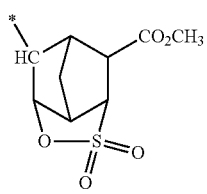 (r-sl-1-10)
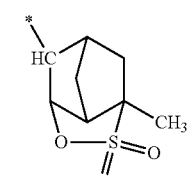 (r-sl-1-11)
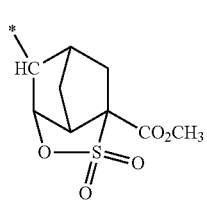 (r-sl-1-12)
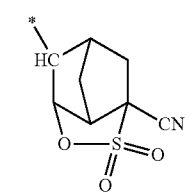 (r-sl-1-13)
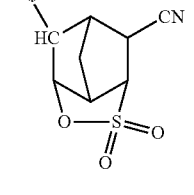 (r-sl-1-14)
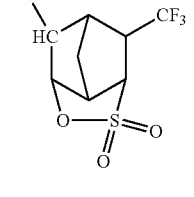 (r-sl-1-15)
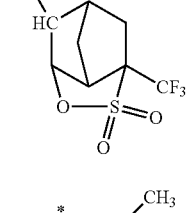 (r-sl-1-16)
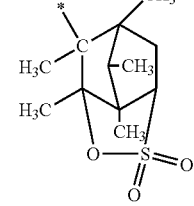 (r-sl-1-17)
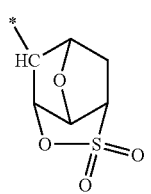 (r-sl-1-18)
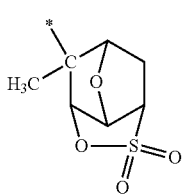 (r-sl-1-19)
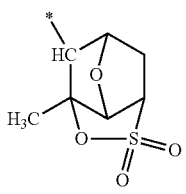 (r-sl-1-20)
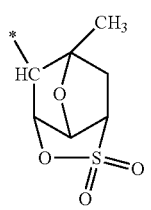 (r-sl-1-21)
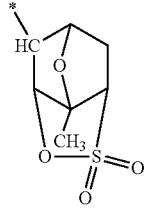 (r-sl-1-22)
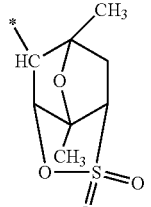 (r-sl-1-23)
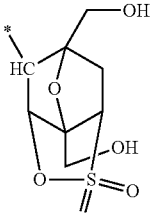 (r-sl-1-24)

-continued (r-sl-1-25) 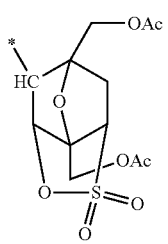

(r-sl-1-26) 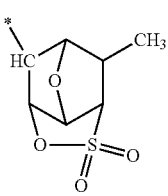

(r-sl-1-27) 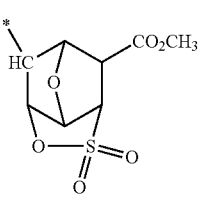

(r-sl-1-28) 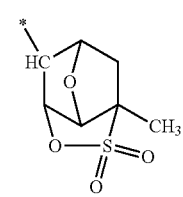

(r-sl-1-29) 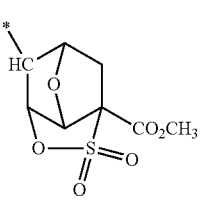

(r-sl-1-30) 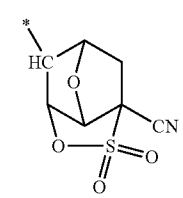

(r-sl-1-31) 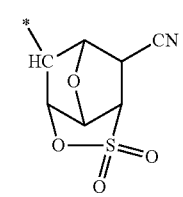

(r-sl-1-32) 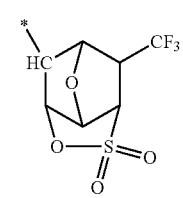

-continued (r-sl-1-33) 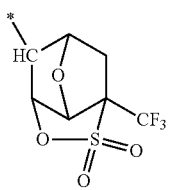

(r-sl-2-1) 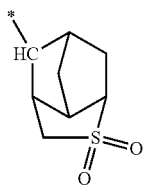

(r-sl-2-2) 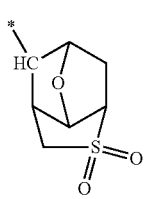

(r-sl-3-1) 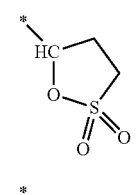

(r-sl-4-1) 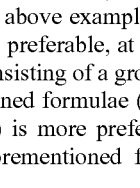

In the present embodiment, when the structural unit (a2) has an Among the above examples, a group represented by formula (a5-r-1) is preferable, at least one member selected from the group consisting of a group represented by any one of the aforementioned formulae (r-sl-1-1), (r-sl-1-18), (r-sl-3-1) and (r-sl-4-1) is more preferable, and a group represented by the aforementioned formula (r-sl-1-1) is most preferable.

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

As the lactone-containing cyclic group, there is no particular limitation, and an arbitrary group may be used. Specific examples include groups represented by general formulas (a2-r-1) to (a2-r-7) shown below. Hereinbelow, "*" indicates the bonding position.

[Chemical Formula 19]

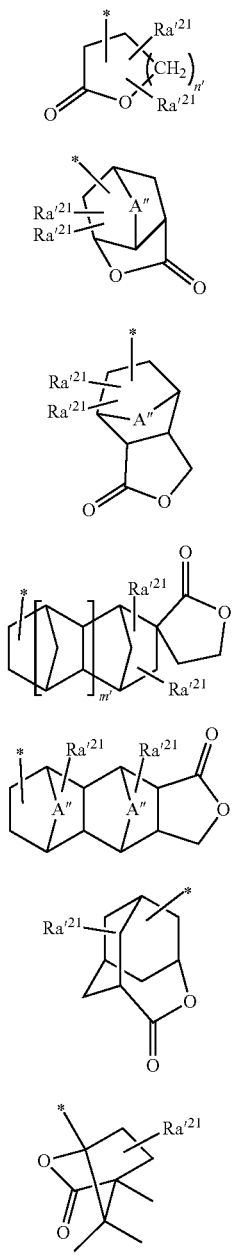

(a2-r-1)
(a2-r-2)
(a2-r-3)
(a2-r-4)
(a2-r-5)
(a2-r-6)
(a2-r-7)

In the formulae, each $Ra'^{21}$ independently represents a hydrogen atom, an alkyl group, an alkoxy group, a halogen atom, a halogenated alkyl group, a hydroxy group, —COOR″, —OC(=O)R″, a hydroxyalkyl group or a cyano group; R″ represents a hydrogen atom or an alkyl group; A″ represents an oxygen atom, a sulfur atom or an alkylene group which may contain an oxygen atom or a sulfur atom; n′ represents an integer of 0 to 2; and m′ represents 0 or 1.

In general formulae (a2-r-1) to (a2-r-7) above, A″ represents an oxygen atom (—O—), a sulfur atom (—S—) or an alkylene group of 1 to 5 carbon atoms which may contain an oxygen atom or a sulfur atom. As the alkylene group of 1 to 5 carbon atoms for A″, a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, and —CH$_2$—S—CH$_2$—. As A″, an alkylene group of 1 to 5 carbon atoms or —O— is preferable, more preferably an alkylene group of 1 to 5 carbon atoms, and most preferably a methylene group. Each $Ra'^{21}$ independently represents an alkyl group, an alkoxy group, a halogen atom, a halogenated alkyl group, —COOR″, —OC(=O)R″, a hydroxyalkyl group or a cyano group.

The alkyl group for $Ra'^{21}$ is preferably an alkyl group of 1 to 5 carbon atoms.

The alkoxy group for $Ra'^{21}$ is preferably an alkoxy group of 1 to 6 carbon atoms. The alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{21}$, a fluorine atom, chlorine atom, bromine atom and iodine atom can be given. Among these, a fluorine atom is preferable.

Examples of the halogenated alkyl group for $Ra'^{21}$ include groups in which part or all of the hydrogen atoms within the aforementioned alkyl group for $Ra'^{21}$ has been substituted with the aforementioned halogen atoms. As the halogenated alkyl group, a fluorinated alkyl group is preferable, and a perfluoroalkyl group is particularly desirable.

Specific examples of the groups represented by the aforementioned general formulae (a2-r-1) to (a2-r-7) are shown below.

[Chemical Formula 20]

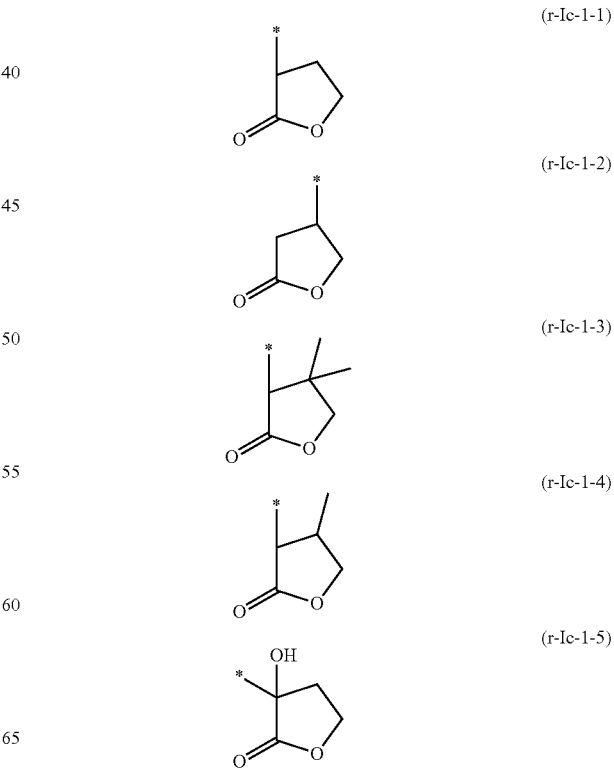

(r-Ic-1-1)
(r-Ic-1-2)
(r-Ic-1-3)
(r-Ic-1-4)
(r-Ic-1-5)

(r-Ic-1-6)
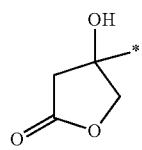
(r-Ic-1-7)
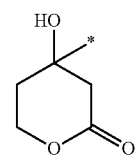
(r-Ic-2-1)
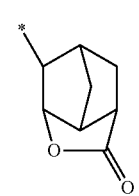
(r-Ic-2-2)
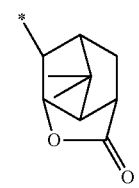
(r-Ic-2-3)
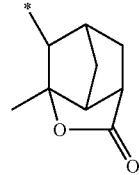
(r-Ic-2-4)
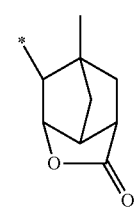
(r-Ic-2-5)
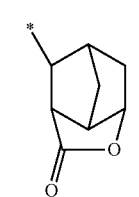
(r-Ic-2-6)
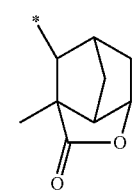
(r-Ic-2-7)
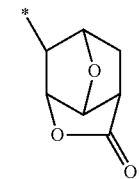
(r-Ic-2-8)
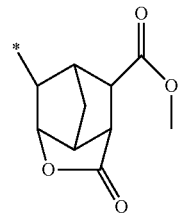
(r-Ic-2-9)
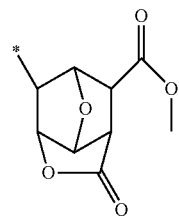
(r-Ic-2-10)
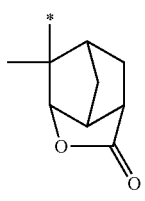
(r-Ic-2-11)
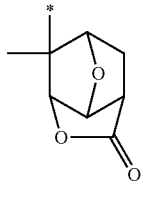
(r-Ic-2-12)
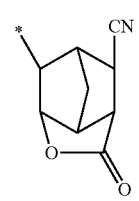
(r-Ic-2-13)
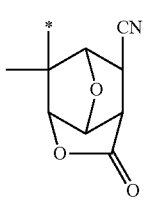
(r-Ic-3-1)
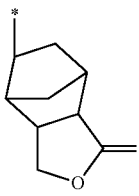

-continued
(r-Ic-3-2)
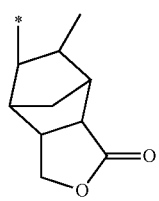
(r-Ic-3-3)
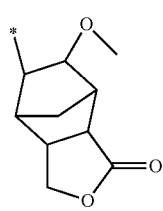
(r-Ic-3-4)
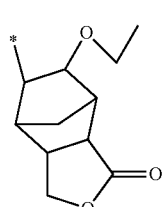
(r-Ic-3-5)
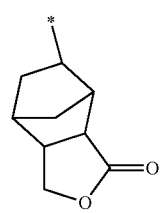
(r-Ic-4-1)
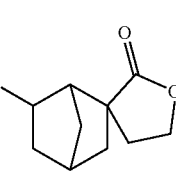
(r-Ic-4-2)
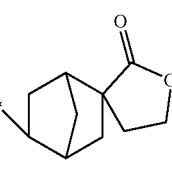
(r-Ic-4-3)
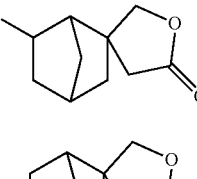
(r-Ic-4-4)
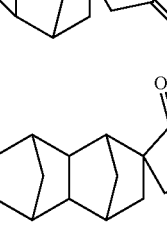
-continued
(r-Ic-4-6)
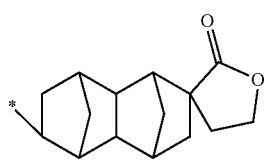
(r-Ic-4-7)
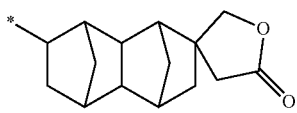
(r-Ic-4-8)
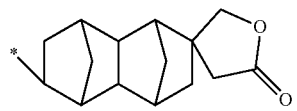
(r-Ic-4-9)
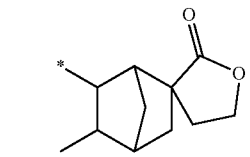
(r-Ic-5-1)
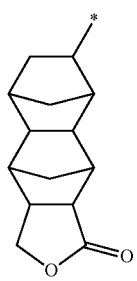
(r-Ic-5-2)
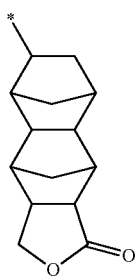
(r-Ic-5-3)
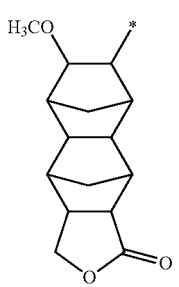

-continued (r-lc-5-4)

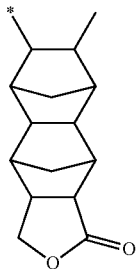

(r-lc-6-1)

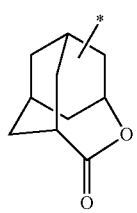

(r-lc-7-1)

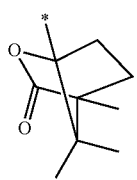

In the present embodiment, the structural unit (a2) preferably has a group represented by the aforementioned formula (a2-r-1) or (a2-r-2), and more preferably a group represented by the aforementioned formula (r-lc-1-1) or (r-lc-2-7).

The term "carbonate-containing cyclic group" refers to a cyclic group including a ring containing a —O—C(=O)—O— structure (carbonate ring). The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

Specific examples include groups represented by general formulas (ax3-r-1) to (ax3-r-3) shown below.

[Chemical Formula 21]

(ax3-r-1)

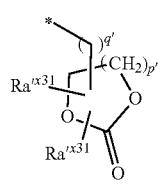

-continued (ax3-r-2)

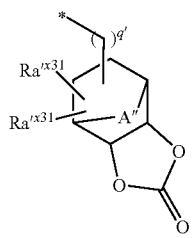

(ax3-r-3)

In the formulae, each $Ra'^{x31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and q' represents 0 or 1.

In general formulae (ax3-r-1) to (ax3-r-3), specific examples of A" is the same as defined for A" in general formulae (a2-r-1) to (a2-r-7). Examples of the alkyl group, alkoxy group, halogen atom, halogenated alkyl group, —COOR", —OC(=O)R" and hydroxyalkyl group for $Ra'^{x31}$ include the same groups as those described above in the explanation of $Ra'^{21}$ in the general formulas (a2-r-1) to (a2-r-7).

Specific examples of the groups represented by the aforementioned general formulae (ax3-r-1) to (ax3-r-3) are shown below.

[Chemical Formula 22]

(r-cr-1-1)

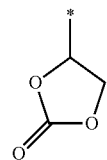

(r-cr-1-2)

(r-cr-1-3)
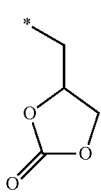
(r-cr-1-4)
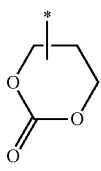
(r-cr-1-5)
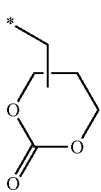
(r-cr-1-6)
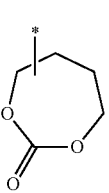
(r-cr-1-6)
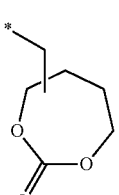
(r-cr-2-1)
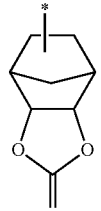
(r-cr-2-2)
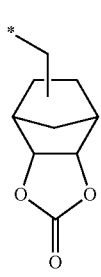
(r-cr-2-3)
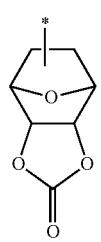
(r-cr-2-4)
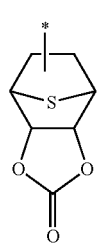
(r-cr-3-1)
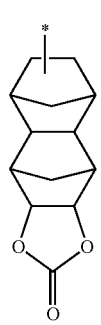
(r-cr-3-2)
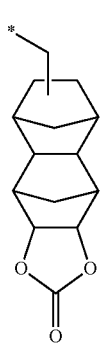
(r-cr-3-3)
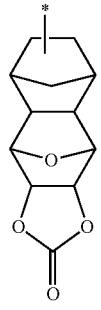

-continued (r-cr-3-4)

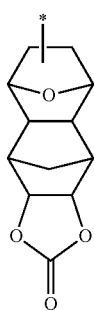

(r-cr-3-5)

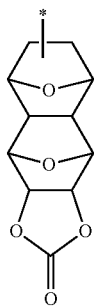

A "heterocyclic group" refers to a cyclic group containing, in addition to carbon, at least one atom other than carbon. Examples of heterocyclic groups include groups represented by formulae (r-hr-1) to (r-hr-16) shown below, and nitrogen-containing heterocyclic groups. Examples of the nitrogen-containing heterocyclic groups include cycloalkyl groups of 3 to 8 carbon atoms which may be substituted with 1 or 2 oxo groups. Preferable examples of the cycloalkyl group include 2,5-dioxopyrrolidine and 2,6-dioxopiperidine.

[Chemical Formula 23]

(r-hr-1)

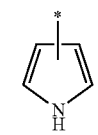

(r-hr-2)

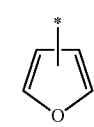

(r-hr-3)

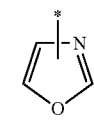

(r-hr-4)

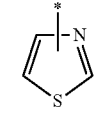

(r-hr-5)

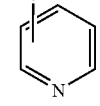

(r-hr-6)

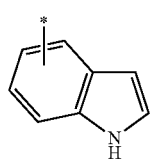

(r-hr-7)

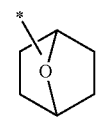

(r-hr-8)

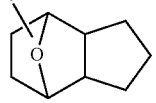

(r-hr-9)

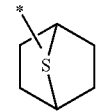

(r-hr-10)

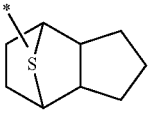

(r-hr-11)

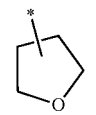

(r-hr-12)

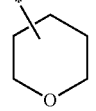

(r-hr-13)

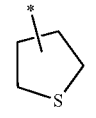

(r-hr-14)

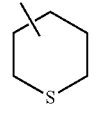

(r-hr-15)

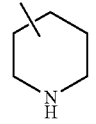

(r-hr-16)

The structural unit (a2) preferably contains a lactone-containing cyclic group, and more preferably a lactone-containing cyclic group represented by any one of the aforementioned formulae (a2-r-1) to (a2-r-7). It is most preferable that the structural unit (a2) contains a lactone-containing cyclic group represented by the aforementioned formula (a2-r-1).

Specific examples of structural unit (a2) having a lactone-containing cyclic group are shown below. In the formulae shown below, R<sup>α</sup> represents a hydrogen atom, a methyl group or a trifluoromethyl group.

[Chemical Formula 24]

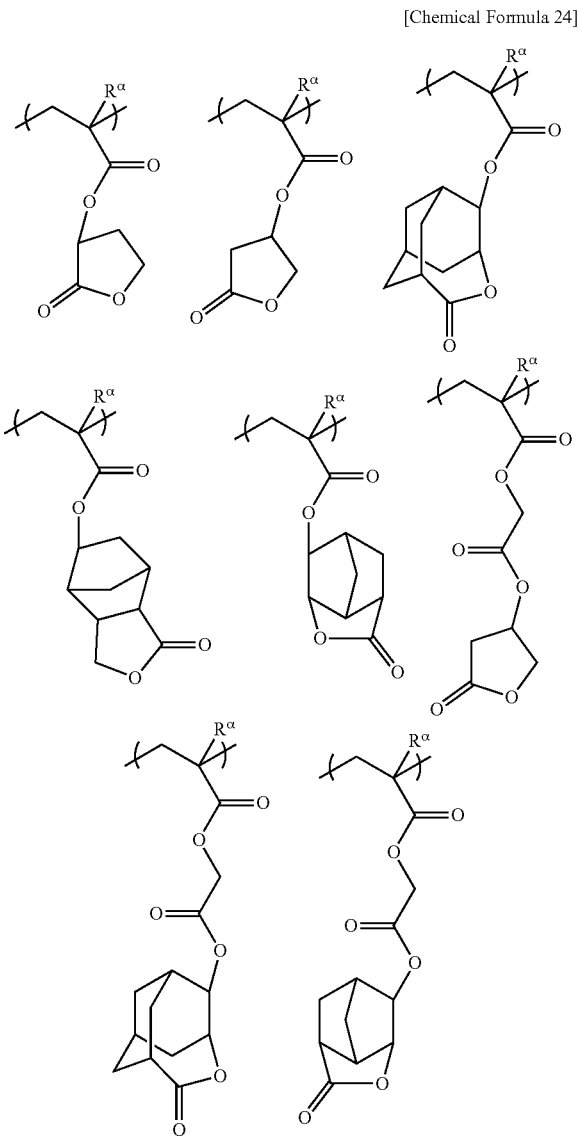

When the polymeric compound (A1) includes a structural unit (a2), as the structural unit (a2), one kind of structural unit may be used, or two or more kinds of structural units may be used.

In the component (A), the amount of the structural unit (a2) based on the combined total of all structural units constituting the component (A) is preferably 1 to 60 mol %, and more preferably 20 to 55 mol %.

When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties and pattern shape can be improved.

(Structural Unit (a3))

The structural unit (a3) is a structural unit containing a polar group-containing aliphatic hydrocarbon group (provided that the structural units that fall under the definition of structural units (a1) and (a2) are excluded).

When the polymeric compound (A1) includes the structural unit (a3), it is presumed that the hydrophilicity of the polymeric compound (A1) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, a structural unit represented by any one of formulae (a3-1) to (a3-5) shown below are preferable, and a structural unit represented by formula (a3-1) shown below is more preferable.

[Chemical Formula 25]

(a3-1)
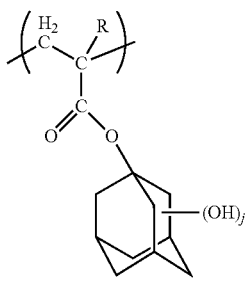

(a3-2)
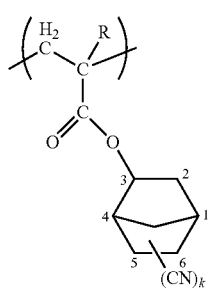

(a3-3)
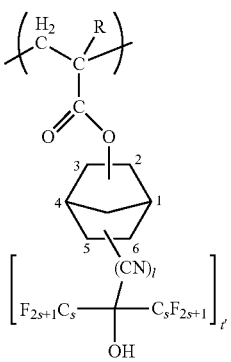

(a3-4)
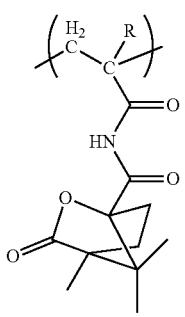

(a3-5)
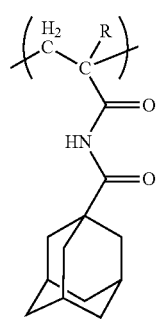

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

With respect to the structural unit (a3) contained in the polymeric compound (A1), one kind of structural unit may be used, or two or more kinds of structural units may be used.

When the structural unit (a3) is included in the polymeric compound (A1), the amount of the structural unit (a3) based on the combined total of all structural units constituting the polymeric compound (A1) is preferably 5 to 40 mol %, more preferably 5 to 30 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

The polymeric compound (A1) may also include a structural unit (a4) which is other than the above-mentioned structural units (a1), (a2) and (a3).

(Structural Unit (a4))

The structural unit (a4) is a structural unit containing an acid non-dissociable cyclic group. When the polymeric compound (A1) includes the structural unit (a4), dry etching resistance of the resist pattern to be formed is improved. Further, the hydrophobicity of the polymeric compound (A1) is further improved. Increase in the hydrophobicity contributes to improvement in terms of resolution, shape of the resist pattern and the like, particularly in an organic solvent developing process.

An "acid non-dissociable, aliphatic cyclic group" in the structural unit (a4) refers to a cyclic group which is not dissociated by the action of acid generated from the component (B) described later upon exposure, and remains in the structural unit.

As the structural unit (a4), a structural unit which contains a non-acid-dissociable aliphatic cyclic group, and is also derived from an acrylate ester is preferable. As the cyclic group, the same groups as those described above for the aforementioned structural unit (a1) may be mentioned, and any of the multitude of conventional polycyclic groups used within the resin component of resist compositions for ArF excimer lasers or KrF excimer lasers (and particularly for ArF excimer lasers) may be used.

As the aliphatic polycyclic group, at least one polycyclic group selected from amongst a tricyclodecyl group, adamantyl group, tetracyclododecyl group, isobornyl group, and norbornyl group is particularly desirable in consideration of industrial availability and the like. These polycyclic groups may be substituted with a linear or branched alkyl group of 1 to 5 carbon atoms.

Specific examples of the structural unit (a4) include units with structures represented by general formulas (a4-1) to (a4-7) shown below.

[Chemical Formula 26]

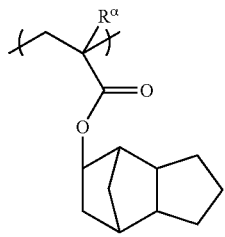

(a4-1)

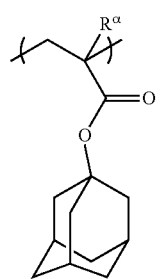

(a4-2)

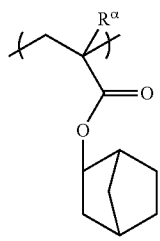

(a4-3)

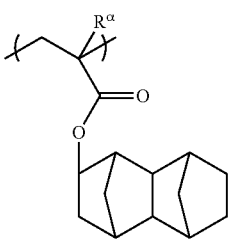

(a4-4)

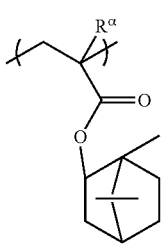

(a4-5)

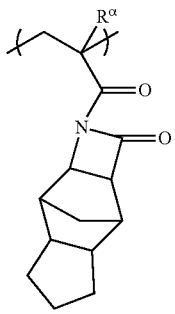

(a4-6)

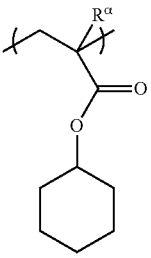

(a4-7)

In the formulae, Ra represents a hydrogen atom, a methyl group or a trifluoromethyl group.

With respect to the structural unit (a4) contained in the polymeric compound (A1), one kind of structural unit may be used, or two or more kinds of structural units may be used.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

The polymeric compound (A1) is preferably a copolymer containing the structural units (a1) and (a2), or a copolymer containing the structural units (a1), (a2) and (a3).

The polymeric compound (A1) may be obtained, for example, by a conventional radical polymerization or the like of the monomers corresponding with each of the structural units, using a radical polymerization initiator such as azobisisobutyronitrile (AIBN) or dimethyl 2,2'-azobis (isobutyrate).

In the polymerization of the polymeric compound (A1), a chain transfer agent such as HS—$CH_2$—$CH_2$—$CH_2$—C($CF_3$)$_2$—OH may be used to introduce a —C($CF_3$)$_2$—OH group at the terminal(s) of the polymer. Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

In the present embodiment, the weight average molecular weight (Mw) (the polystyrene equivalent value determined by gel permeation chromatography) of the polymeric compound (A1) is not particularly limited, but is preferably 1,000 to 50,000, more preferably 1,500 to 30,000, still more preferably 2,000 to 20,000, and most preferably 5,000 to 16,000. When the Mw of the polymeric compound (A1) is no more than the upper limit of the above-mentioned preferable range, the resist composition exhibits a satisfactory solubility in a resist solvent. On the other hand, when the Mw of the polymeric compound (A1) is at least as large as the lower limit of the above-mentioned preferable range, dry etching resistance and the cross-sectional shape of the resist pattern becomes satisfactory.

As the polymeric compound (A1), one kind of compound may be used, or two or more kinds of compounds may be used.

In the component (A), the amount of the polymeric compound (A1) based on the total weight of the component (A) is preferably 25% by weight or more, more preferably 50% by weight or more, still more preferably 75% by weight or more, and may be 100% by weight. When the amount of the component (A1) is 25% by weight or more, various lithography properties are improved.

In the present embodiment, as the component (A), one kind of compound may be used, or two or more kinds of compounds may be used in combination.

In the present embodiment, the amount of the component (A) can be appropriately adjusted depending on the thickness of the resist film to be formed, and the like.

<Acid Generator Component; Component (B)>

The resist composition of the present embodiment may include, in addition to the components (A), an acid-generator component (hereafter, sometimes referred to as "component (B)").

As the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these examples, it is preferable to use an onium salt acid generator.

As the onium salt acid generator, a compound represented by general formula (b-1) below (hereafter, sometimes referred to as "component (b-1)"), a compound represented by general formula (b-2) below (hereafter, sometimes referred to as "component (b-2)") or a compound represented by general formula (b-3) below (hereafter, sometimes referred to as "component (b-3)") may be mentioned.

[Chemical Formula 27]

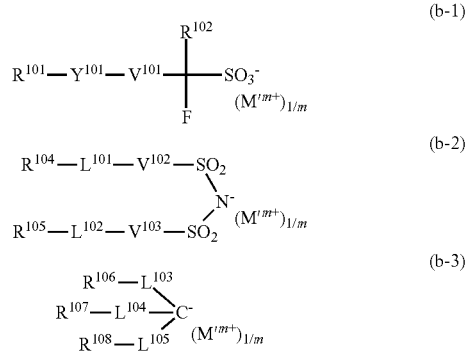

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; m represents an integer of 1 or more, and $M^{m+}$ represents an onium cation having a valency of m.

{Anion Moiety}

Anion Moiety of Component (b-1)

In the formula (b-1), $R^{101}$ represents a cyclic group which may have a substituent, a chain-like alkyl group which may have a substituent or a chain-like alkenyl group which may have a substituent.

Cyclic group which may have a substituent:

The cyclic group is preferably a cyclic hydrocarbon group, and the cyclic hydrocarbon group may be either an aromatic hydrocarbon group or an aliphatic hydrocarbon group. An "aliphatic hydrocarbon group" refers to a hydrocarbon group that has no aromaticity. The aliphatic hydrocarbon group may be either saturated or unsaturated, but in general, the aliphatic hydrocarbon group is preferably saturated.

The aromatic hydrocarbon group for $R^{101}$ is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Specific examples of the aromatic ring contained in the aromatic hydrocarbon group for $R^{101}$ include benzene, fluorene, naphthalene, anthracene, phenanthrene, biphenyl, or an aromatic hetero ring in which part of the carbon atoms constituting any one of these aromatic rings have been substituted with a hetero atom. Examples of the hetero atom within the aromatic hetero rings include an oxygen atom, a sulfur atom and a nitrogen atom.

Specific examples of the aromatic hydrocarbon group represented by $R^{101}$ include a group in which one hydrogen atom has been removed from the aforementioned aromatic ring (i.e., an aryl group, such as a phenyl group or a naphthyl group), and a group in which one hydrogen of the aforementioned aromatic ring has been substituted with an alkylene group (e.g., an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

Examples of the cyclic aliphatic hydrocarbon group for $R^{101}$ include aliphatic hydrocarbon groups containing a ring in the structure thereof.

Examples of the aliphatic hydrocarbon group containing a ring in the structure thereof include an alicyclic hydrocarbon group (a group in which 1 hydrogen atom has been removed from an aliphatic hydrocarbon ring); a group in which an alicyclic hydrocarbon group is bonded to a terminal of a linear or branched aliphatic hydrocarbon group; and a group in which an alicyclic hydrocarbon group is present between carbon atoms of a linear or branched aliphatic hydrocarbon group.

The alicyclic hydrocarbon group preferably has 3 to 20 carbon atoms, and more preferably 3 to 12 carbon atoms.

The alicyclic hydrocarbon group for $R^{101}$ may be either a polycyclic group or a monocyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the polycyclic group preferably has 7 to 30 carbon atoms. Among polycycloalkanes, a polycycloalkane having a bridged ring polycyclic skeleton, such as adamantane, norbornane, isobornane, tricyclodecane or tetracyclodpdecane, and a polycycloalkane having a condensed ring polycyclic skeleton, such as a cyclic group having a steroid skeleton are preferable.

Among these examples, as the cyclic aliphatic hydrocarbon group for $R^{101}$, a group in which one or more hydrogen atoms have been removed from a monocycloalkane or a polycycloalkane is preferable, a group in which one or more hydrogen atoms have been removed from a polycycloalkane is more preferable, an adamantyl group or a norbornyl group is still more preferable, and an adamantyl group is most preferable.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The cyclic hydrocarbon group for $R^{101}$ may contain a hetero atom such as a heterocycle. Specific examples include lactone-containing cyclic groups represented by the aforementioned general formulae (a2-r-1) to (a2-r-7), the —$SO_2$— containing polycyclic groups represented by the aforementioned general formulae (a5-r-1) to (a5-r-2), and other heterocyclic groups represented by chemical formulae (r-hr-1) to (r-hr-16) shown below.

[Chemical Formula 28]

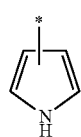
(r-hr-1)

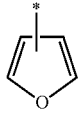
(r-hr-2)

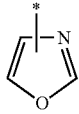
(r-hr-3)

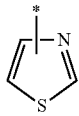
(r-hr-4)

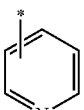
(r-hr-5)

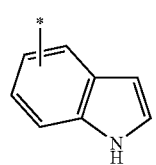
(r-hr-6)

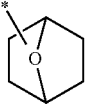
(r-hr-7)

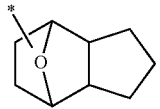
(r-hr-8)

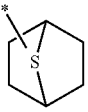
(r-hr-9)

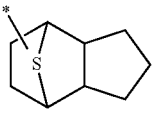
(r-hr-10)

(r-hr-11)

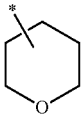
(r-hr-12)

(r-hr-13)

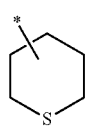
(r-hr-14)

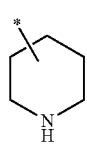
(r-hr-15)

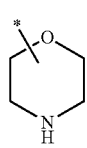
(r-hr-16)

As the substituent for the cyclic group for $R^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The carbonyl group as the substituent is a group that substitutes a methylene group ($—CH_2—$) constituting the cyclic hydrocarbon group.

Chain alkyl group which may have a substituent:

The chain-like alkyl group for $R^{101}$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

Chain alkenyl group which may have a substituent:

The chain-like alkenyl group for $R^{101}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylvinyl group, a 2-methylvinyl group, a 1-methylpropenyl group and a 2-methylpropenyl group.

Among these examples, as the chain-like alkenyl group, a linear alkenyl group is preferable, a vinyl group or a propenyl group is more preferable, and a vinyl group is most preferable.

As the substituent for the chain-like alkyl group or alkenyl group for $R^{101}$, an alkoxy group, a halogen atom, a halogenated alkyl group, a hydroxyl group, a carbonyl group, a nitro group, an amino group, a cyclic group for $R^{101}$ or the like can be used.

Among these examples, $R^{101}$ is preferably a cyclic group which may have a substituent or a chain-like alkyl group which may have a substituent, more preferably a cyclic group which may have a substituent, and still more preferably a cyclic hydrocarbon group which may have a substituent.

Among these examples, a phenyl group, a naphthyl group, a group in which one or more hydrogen atoms have been removed from a polycycloalkane, a lactone-containing cyclic group represented by any one of the aforementioned formulae (a2-r-1) to (a2-r-7), an $—SO_2—$ containing polycyclic group represented by any one of the aforementioned general formulae (a5-r-1) and (a5-r-2) is preferable, and a group in which one or more hydrogen atoms have been removed from a polycycloalkane or an $—SO_2—$ containing polycyclic group represented by any one of the aforementioned general formulae (a5-r-1) to (a5-r-2) is more preferable.

In formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; $—O—$), an ester bond ($—C(=O)—O—$), an oxycarbonyl group ($—O—C(=O)—$), an amido bond ($—C(=O)—NH—$), a carbonyl group ($—C(=O)—$) and a carbonate bond ($—O—C(=O)—O—$); and combinations of the aforementioned non-hydrocarbon, hetero atom-containing linking groups with an alkylene group. Furthermore, the combinations may have a sulfonyl group ($—SO_2—$) bonded thereto. Examples of the divalent linking group containing an oxygen atom include divalent linking groups represented by general formula (y-al-1) to (y-al-7) shown below.

[Chemical Formula 29]

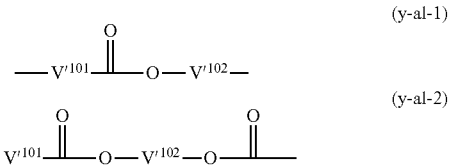

-continued

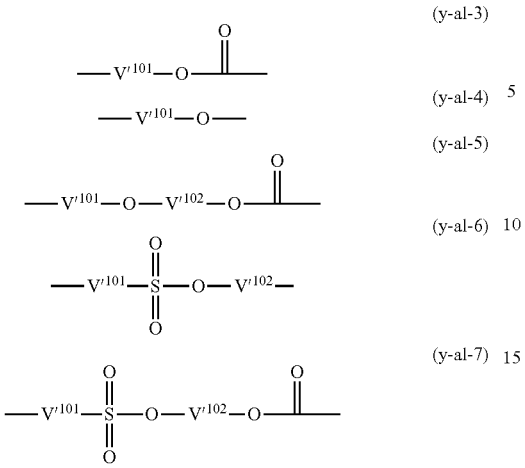

(y-al-3)
(y-al-4)
(y-al-5)
(y-al-6)
(y-al-7)

In the formulae, $V'^{101}$ represents a single bond or an alkylene group of 1 to 5 carbon atoms; $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms, more preferably an alkylene group of 1 to 10 carbon atoms, and still more preferably an alkylene group of 1 to 5 carbon atoms.

The alkylene group for $V'^{101}$ and $V'^{102}$ may be a linear alkylene group or a branched alkylene group, and a linear alkylene group is preferable.

Specific examples of the alkylene group for $V'^{101}$ and $V'^{102}$ include a methylene group [—$CH_2$—]; an alkylmethylene group, such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an ethylene group [—$CH_2CH_2$—]; an alkylethylene group, such as —$CH(CH_3)CH_2$—, —$CH(CH_3)CH(CH_3)$—, —$C(CH_3)_2CH_2$—, and —$CH(CH_2CH_3)CH_2$—; a trimethylene group (n-propylene group) [—$CH_2CH_2CH_2$—]; an alkyltrimethylene group, such as —$CH(CH_3)CH_2CH_2$—, and —$CH_2CH(CH_3)CH_2$—; a tetramethylene group [—$CH_2CH_2CH_2CH_2$—]; an alkyltetramethylene group, such as —$CH(CH_3)CH_2CH_2CH_2$—, and —$CH_2CH(CH_3)CH_2CH_2$—; and a pentamethylene group [—$CH_2CH_2CH_2CH_2CH_2$—].

Further, part of methylene group within the alkylene group for $V'^{101}$ and $V'^{102}$ may be substituted with a divalent aliphatic cyclic group of 5 to 10 carbon atoms.

$Y^{101}$ is preferably a divalent linking group containing an ether bond or a divalent linking group containing an ester bond, and groups represented by the aforementioned formulae (y-al-1) to (y-al-5) are preferable, and groups represented by the aforementioned formulae (y-al-1) to (y-al-3) are more preferable.

In formula (b-1), $V^{101}$ represents a single bond, an alkylene group or a fluorinated alkylene group. The alkylene group and the fluorinated alkylene group for $V^{101}$ preferably has 1 to 4 carbon atoms. Examples of the fluorinated alkylene group for $V^{101}$ include a group in which part or all of the hydrogen atoms within the alkylene group for $V^{101}$ have been substituted with fluorine. Among these examples, as $V^{101}$, a single bond or a fluorinated alkylene group of 1 to 4 carbon atoms is preferable.

In formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and more preferably a fluorine atom.

As a specific example of the anion moiety for the component (b-1), in the case where $Y^{101}$ is a single bond, a fluorinated alkylsulfonate anion such as a trifluoromethanesulfonate anion or a perfluorobutanesulfonate anion can be mentioned; and in the case where $Y^{101}$ represents a divalent linking group containing an oxygen atom, anions represented by formulae (an-1) to (an-3) shown below can be mentioned.

[Chemical Formula 30]

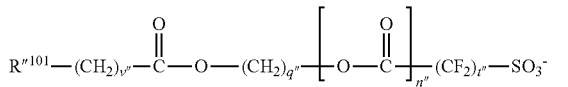

(an-1)

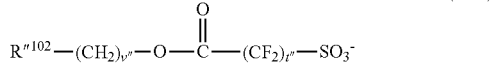

(an-2)

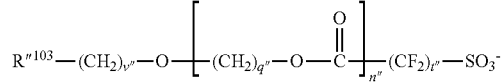

(an-3)

In the formulae, $R'''^{101}$ represents an aliphatic cyclic group which may have a substituent, a group represented by any one of the aforementioned formulas (r-hr-1) to (r-hr-6) or a chain-like alkyl group which may have a substituent; $R'''^{102}$ represents an aliphatic cyclic group which may have a substituent, a lactone-containing cyclic group represented by any one of the aforementioned formulae (a2-r-1) to (a2-r-7) or an —$SO_2$— containing cyclic group represented by any one of the aforementioned formulae (a5-r-1) to (a5-r-4); $R'''^{103}$ represents an aromatic cyclic group which may have a substituent, an aliphatic cyclic group which may have a substituent or a chain-like alkenyl group which may have a substituent; v" represents an integer of 0 to 3; q" represents an integer of 1 to 20; t" represents an integer of 1 to 3; and n" represents 0 or 1.

As the aliphatic cyclic group for $R'''^{101}$, $R'''^{102}$ and $R'''^{103}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R'''^{103}$ which may have a substituent, the same groups as the aromatic hydrocarbon group for the cyclic hydrocarbon group represented by $R^{101}$ described above are preferable. The substituent is the same as defined for the substituent for the aromatic hydrocarbon group represented by $R^{101}$.

As the chain-like alkyl group for $R'''^{101}$ which may have a substituent, the same groups as those described above for $R^{101}$ are preferable. As the chain-like alkenyl group for $R'''^{103}$ which may have a substituent, the same groups as those described above for $R^{101}$ are preferable.

Anion Moiety of Component (b-2)

In formula (b-2), $R^{104}$ and $R^{105}$ each independently represents a cyclic group which may have a substituent, a chain-like alkyl group which may have a substituent or a chain-like alkenyl group which may have a substituent, and is the same as defined for $R^{101}$ in formula (b-1). $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved.

The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same as defined for $V^{101}$ in formula (b-1).

In formula (b-2), $L^{101}$ and $L^{102}$ each independently represents a single bond or an oxygen atom.

Anion Moiety of Component (b-3)

In formula (b-3), $R^{106}$ to $R^{108}$ each independently represents a cyclic group which may have a substituent, a chain-like alkyl group which may have a substituent or a chain-like alkenyl group which may have a substituent, and is the same as defined for $R^{101}$ in formula (b-1).

$L^{103}$ to $L^{105}$ each independently represents a single bond, —CO— or —SO$_2$—.

{Cation Moiety}

In formulae (b-1), (b-2) and (b-3), m represents an integer of 1 or more, $M'^{m+}$ represents an onium cation having a valency of m, preferably a sulfonium cation or an iodonium cation, and most preferably an organic cation represented by any one of the following formulae (ca-1) to (ca-4).

[Chemical Formula 31]

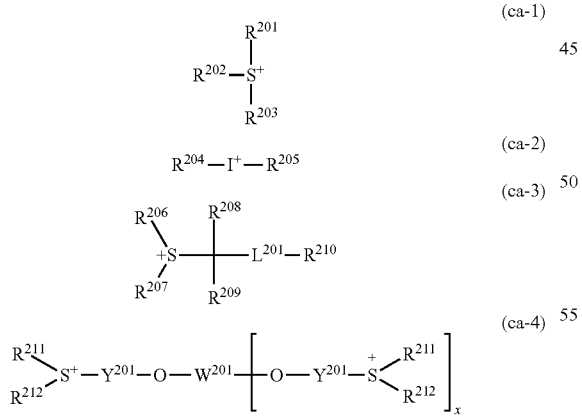

(ca-1)

(ca-2)

(ca-3)

(ca-4)

In the formulae, $R^{201}$ to $R^{207}$, $R^{211}$ and $R^{212}$ each independently represents an aryl group, an alkyl group or an alkenyl group, provided that two of $R^{201}$ to $R^{203}$, $R^{206}$ and $R^{207}$, or $R^{211}$ and $R^{212}$ may be mutually bonded to form a ring with the sulfur atom; $R^{208}$ and $R^{209}$ each independently represents a hydrogen atom or an alkyl group of 1 to 5 carbon atoms; $R^{210}$ represents an aryl group which may have a substituent, an alkyl group which may have a substituent, an alkenyl group which may have a substituent, or an —SO$_2$— containing cyclic group which may have a substituent; $L^{201}$ represents —C(=O)— or —C(=O)—O—; each $Y^{201}$ independently represents an arylene group, an alkylene group or an alkenylene group; x represents 1 or 2; and $W^{201}$ represents a linking group having a valency of (x+1).

As the aryl group for $R^{201}$ to $R^{207}$ and $R^{211}$ to $R^{212}$, an unsubstituted aryl group of 6 to 20 carbon atoms can be mentioned, and a phenyl group or a naphthyl group is preferable.

The alkyl group for $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{207}$ and $R^{211}$ to $R^{212}$ preferably has 2 to 10 carbon atoms.

Specific examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, and groups represented by formulae (ca-r-1) to (ca-r-7) shown below.

[Chemical Formula 32]

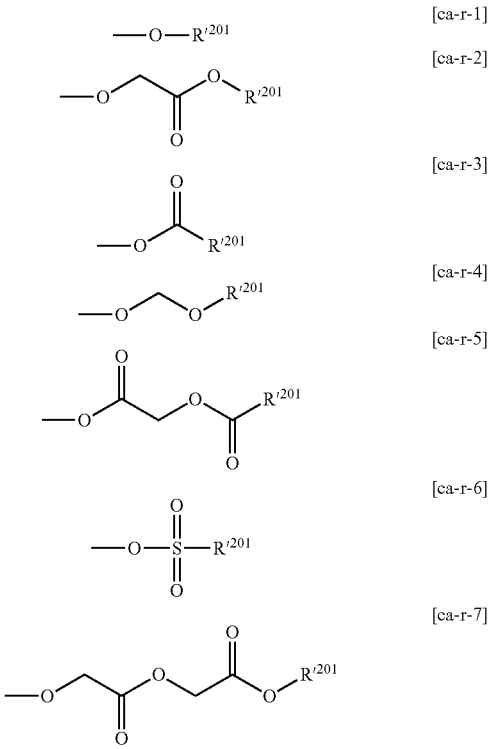

[ca-r-1]

[ca-r-2]

[ca-r-3]

[ca-r-4]

[ca-r-5]

[ca-r-6]

[ca-r-7]

In the formulae, each $R'^{201}$ independently represents a hydrogen atom, a cyclic group which may have a substituent, a chain-like alkyl group which may have a substituent, or a chain-like alkenyl group which may have a substituent.

The cyclic group which may have a substituent, the chain-like alkyl group which may have a substituent, or the chain-like alkenyl group which may have a substituent represented by $R'^{201}$ is the same as defined for $R^{101}$ in the aforementioned formula (b-1). In addition, as the cyclic group which may have a substituent, the chain-like alkyl group which may have a substituent represented by $R'^{201}$, the same groups as those described above for the acid dissociable group in the aforementioned structural unit (a02-1) or (a02-2) may also be mentioned.

In the case where $R^{201}$ to $R^{203}$, $R^{206}$ and $R^{207}$ or $R^{211}$ and $R^{212}$ are mutually bonded with the sulfur atom to form a ring, the groups may be bonded through a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (R$_N$ represents an alkyl group of 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ and $R^{209}$ each independently represents a hydrogen atom or an alkyl group of 1 to 5 carbon atoms, preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group which may have a substituent, an alkyl group which may have a substituent, an alkenyl group which may have a substituent, or an —SO$_2$— containing cyclic group which may have a substituent.

Examples of the aryl group for $R^{210}$ include an unsubstituted aryl group of 6 to 20 carbon atoms, and a phenyl group or a naphthyl group is preferable.

As the alkyl group for $R^{210}$, a chain-like or cyclic alkyl group having 1 to 30 carbon atoms is preferable.

The alkenyl group for $R^{210}$ preferably has 2 to 10 carbon atoms.

As the —SO$_2$— containing cyclic group for $R^{210}$ which may have a substituent, an "—SO$_2$— containing polycyclic group" is preferable, and a group represented by the aforementioned general formula (a5-r-1) is more preferable.

Each $Y^{201}$ independently represents an arylene group, an alkylene group or an alkenylene group.

Examples of the arylene group for $Y^{201}$ include groups in which one hydrogen atom has been removed from an aryl group given as an example of the aromatic hydrocarbon group for $R^{101}$ in the aforementioned formula (b-1).

Examples of the alkylene group and alkenylene group for $Y^{201}$ include groups in which one hydrogen atom has been removed from the chain-like alkyl group or the chain-like alkenyl group given as an example of $R^{101}$ in the aforementioned formula (b-1).

In the formula (ca-4), x represents 1 or 2.

$W^{201}$ represents a linking group having a valency of (x+1), i.e., a divalent or trivalent linking group.

As the divalent linking group for $W^{201}$, a divalent hydrocarbon group which may have a substituent is preferable, and as examples thereof, the same divalent hydrocarbon groups (which may have a substituent) as those described above for Va$^{01}$ in La$^{011}$ in the aforementioned formula (a01-1). The divalent linking group for $W^{201}$ may be linear, branched or cyclic, and is preferably cyclic. Among these, an arylene group having two carbonyl groups, each bonded to the terminal thereof is preferable. Examples of the arylene group include a phenylene group and a naphthylene group, and a phenylene group is particularly desirable.

As the trivalent linking group for $W^{201}$, a group in which one hydrogen atom has been removed from the aforementioned divalent linking group for $W^{201}$ and a group in which the divalent linking group has been bonded to another divalent linking group can be mentioned. The trivalent linking group for $W^{201}$ is preferably a group in which 2 carbonyl groups are bonded to an arylene group.

Specific examples of preferable cations represented by formula (ca-1) include cations represented by formulae (ca-1-1) to (ca-1-67) shown below.

[Chemical Formula 33]

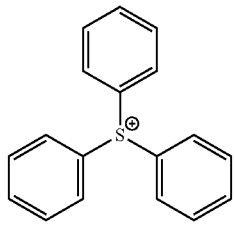

(ca-1-1)

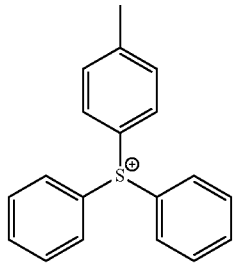

(ca-1-2)

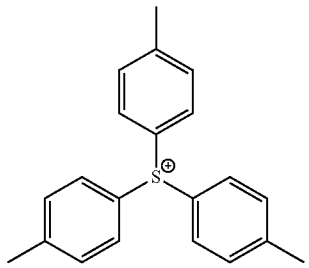

(ca-1-3)

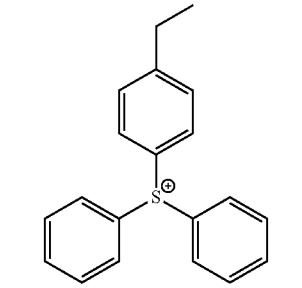

(ca-1-4)

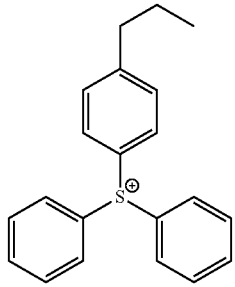

(ca-1-5)

(ca-1-6)
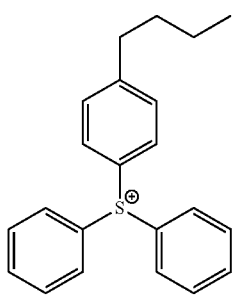
(ca-1-7)
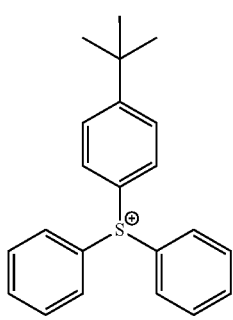
(ca-1-8)
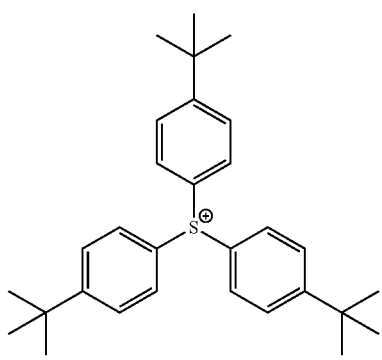
(ca-1-9)
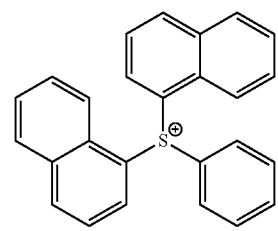
(ca-1-10)
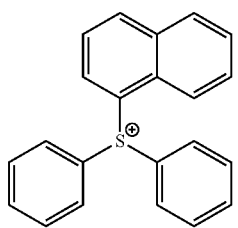
(ca-1-11)
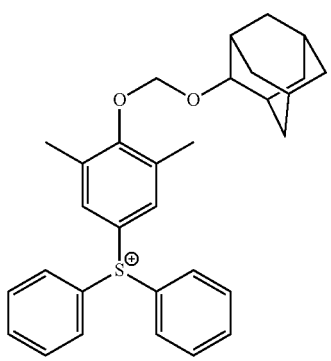
(ca-1-12)
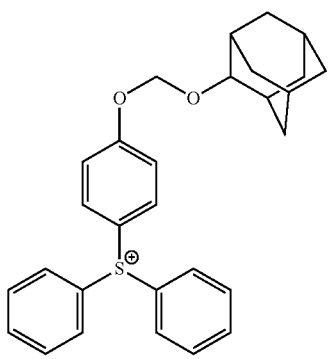
(ca-1-13)
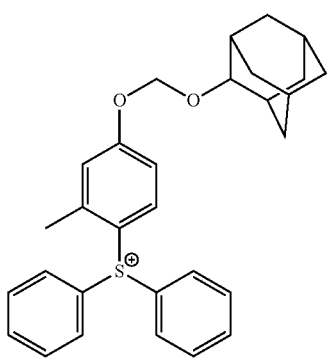
(ca-1-14)
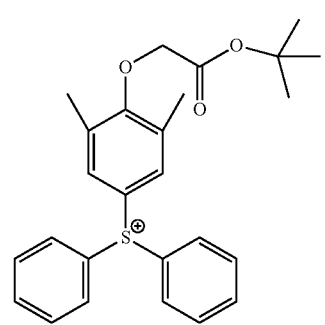

(ca-1-15)
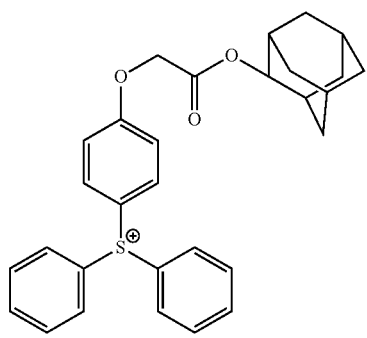
(ca-1-16)
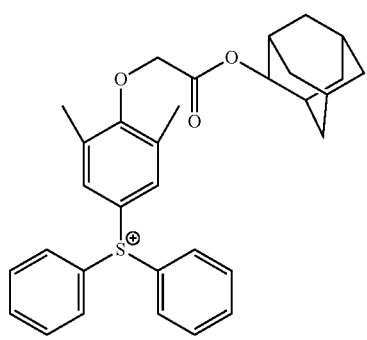
[Chemical Formula 34]
(ca-1-17)
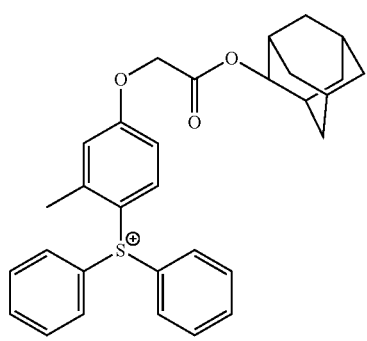
(ca-1-18)
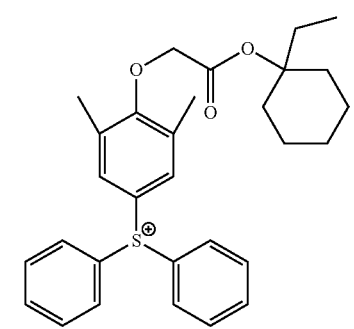
(ca-1-19)
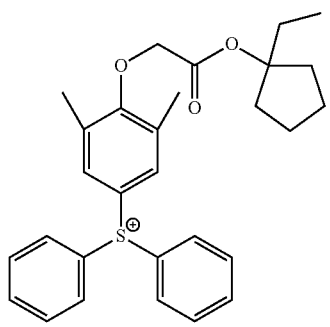
(ca-1-20)
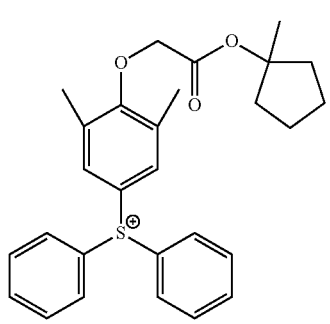
(ca-1-21)
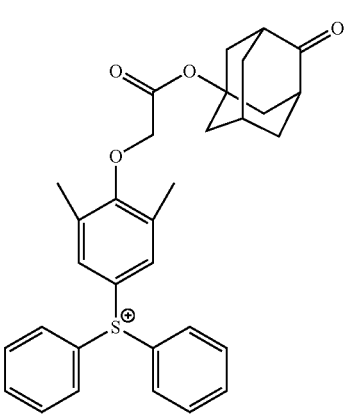
(ca-1-22)
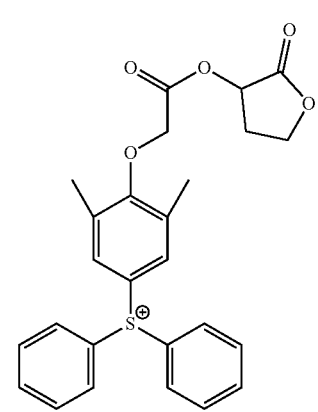

-continued
(ca-1-23)
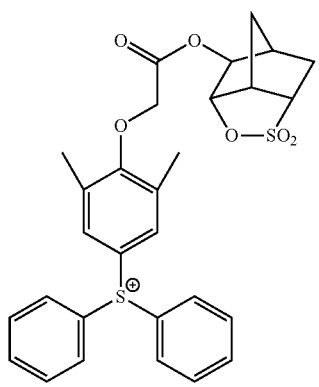
(ca-1-24)
(ca-1-25)
(ca-1-26)
-continued
(ca-1-27)
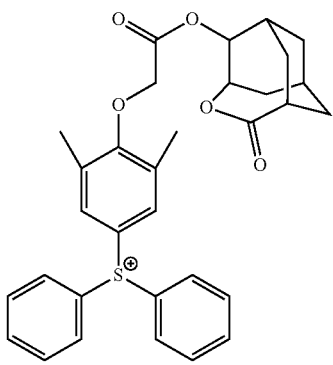
(ca-1-28)
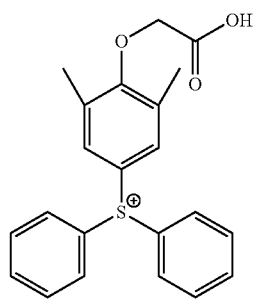
(ca-1-29)
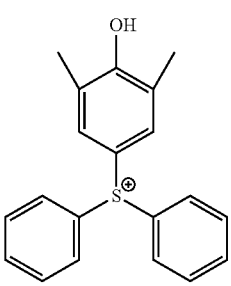
(ca-1-30)
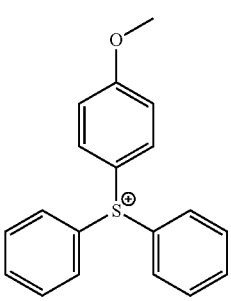
(ca-1-31)
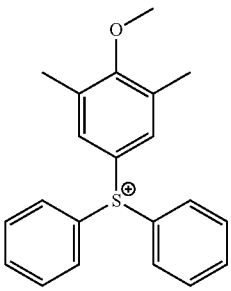

(ca-1-32)
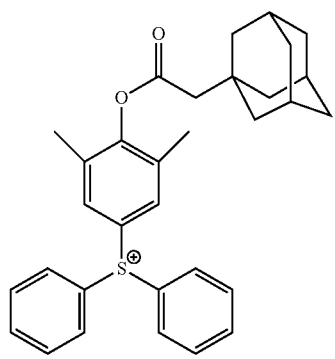
(ca-1-33)
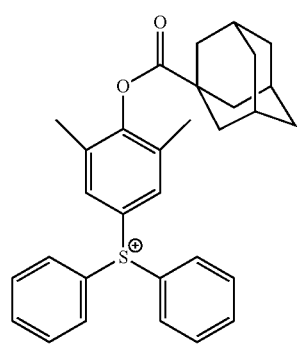
[Chemical Formula 35]
(ca-1-34)
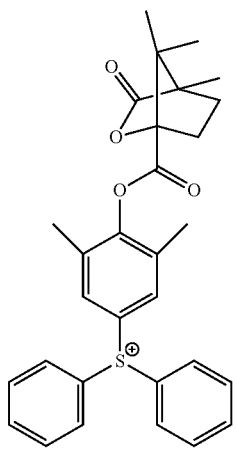
(ca-1-35)
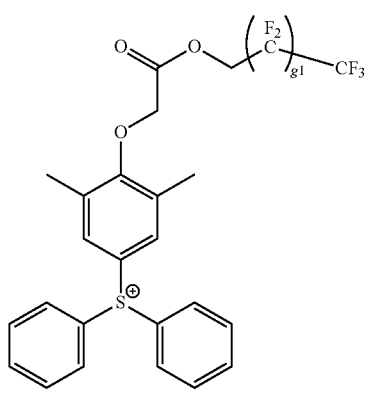
(ca-1-36)
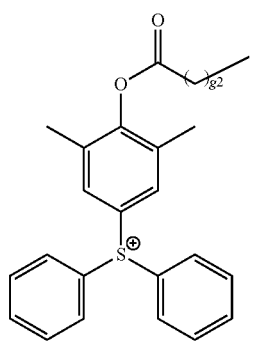
(ca-1-37)
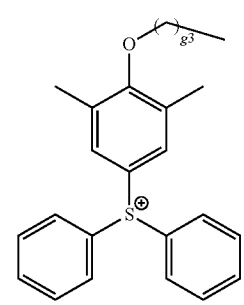
(ca-1-38)
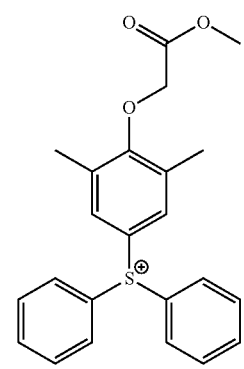
(ca-1-39)
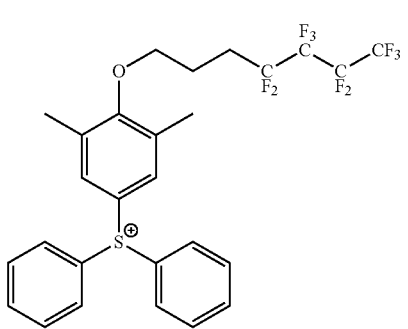

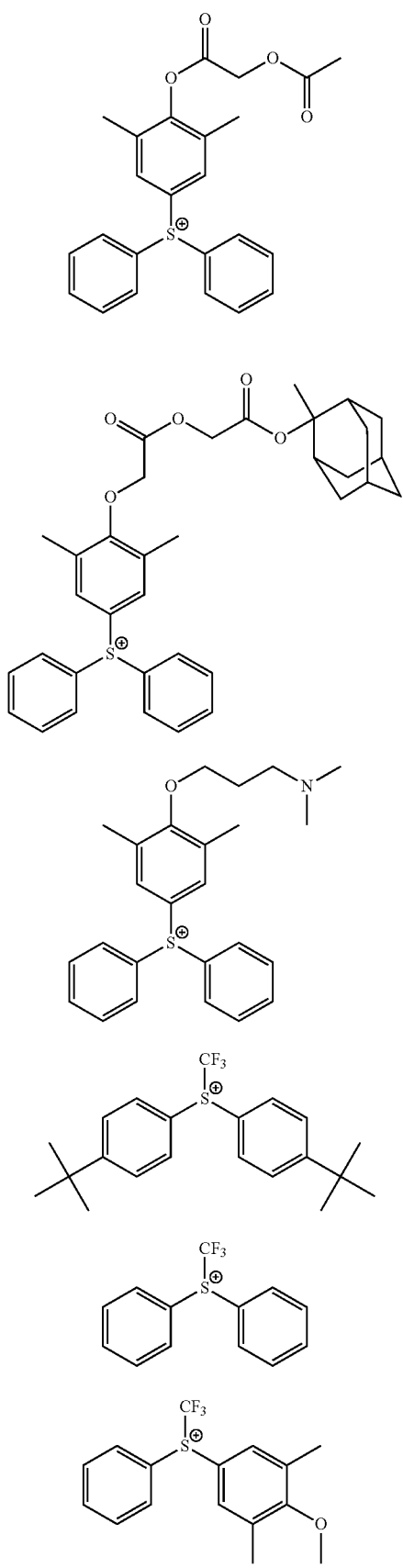
(ca-1-40)
(ca-1-41)
(ca-1-42)
(ca-1-43)
(ca-1-44)
(ca-1-45)
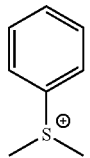
(ca-1-46)
(ca-1-47)
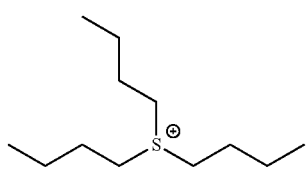
(ca-1-48)
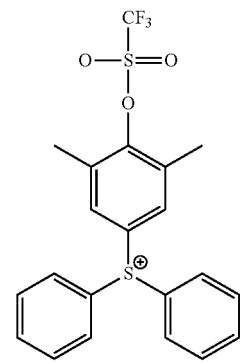
(ca-1-49)
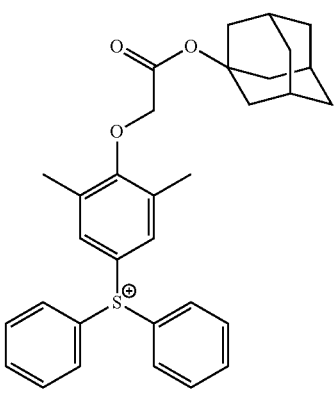
(ca-1-50)
(ca-1-51)
In the formulae, g1, g2 and g3 represent recurring numbers, wherein g1 is an integer of 1 to 5, g2 is an integer of 0 to 20, and g3 is an integer of 0 to 20.

[Chemical Formula 36]
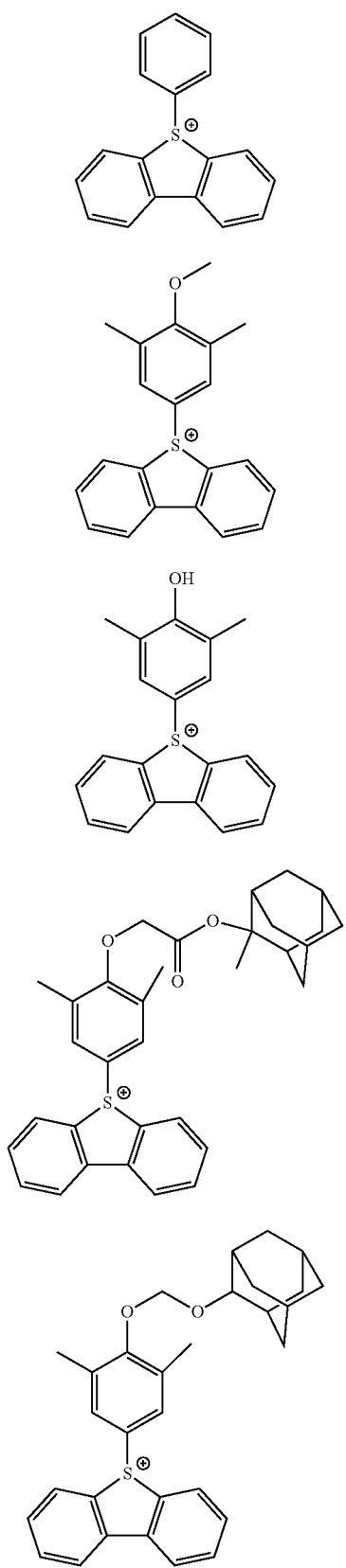

-continued (ca-1-63)
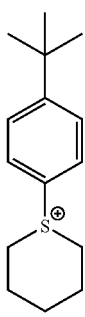

(ca-1-64)
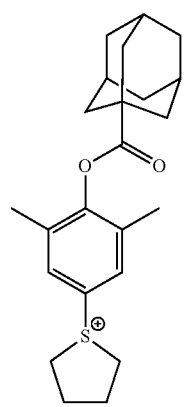

(ca-1-65)
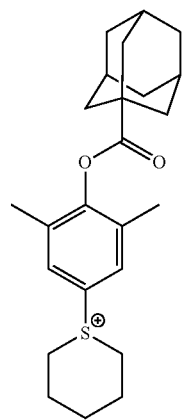

(ca-1-66)
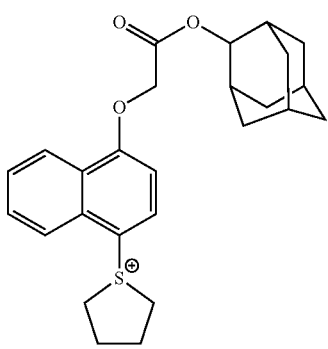

-continued (ca-1-67)
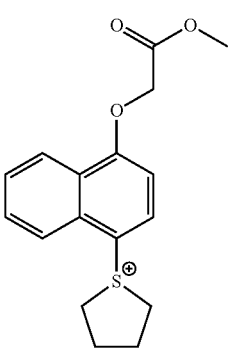

In the formulae, R''$^{201}$ represents a hydrogen atom or a substituent, and as the substituent, the same groups as those described above for substituting R$^{201}$ to R$^{207}$ and R$^{210}$ to R$^{212}$ may be mentioned.

Specific examples of preferable cations represented by the aforementioned formula (ca-2) include a dihphenyliodonium cation and a bis(4-tert-butylphenyl)iodonium cation.

Specific examples of preferable cations represented by formula (ca-3) include cations represented by formulae (ca-3-1) to (ca-3-6) shown below.

[Chemical Formula 37]

(ca-3-1)
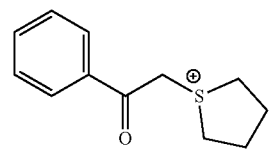

(ca-3-2)
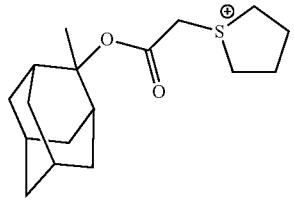

(ca-3-3)
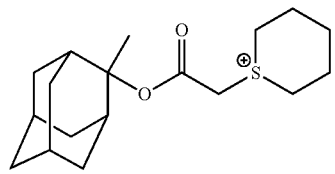

(ca-3-4)
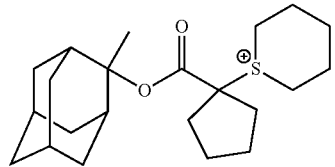

(ca-3-5)
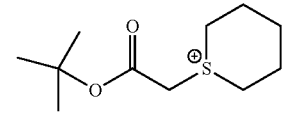

(ca-3-6)

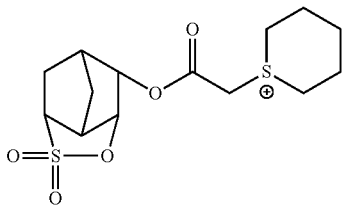

Specific examples of preferable cations represented by formula (ca-4) include cations represented by formulae (ca-4-1) and (ca-4-2) shown below.

[Chemical Formula 38]

(ca-4-1)

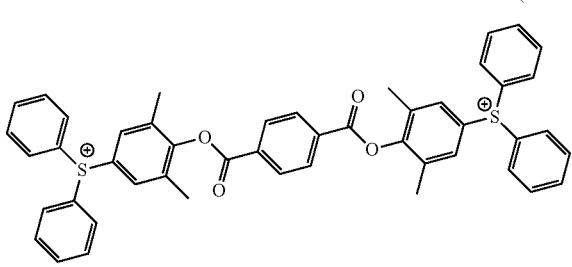

(ca-4-2)

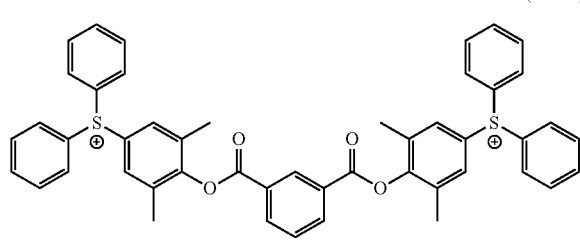

Among the above examples, as the cation moiety $[(M^{m+})_{l/m}]$, a cation represented by general formula (ca-1) is preferable, and a cation represented by any one of formulae (ca-1-1) to (ca-1-67) is more preferable.

As the component (B), one kind of these acid generators may be used, or two or more kinds of acid generators may be used.

When the resist composition contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight.

When the amount of the component (B) is within the above-mentioned range, formation of a resist pattern can be satisfactorily performed. Further, by virtue of the above-mentioned range, when each of the components are dissolved in an organic solvent, a homogeneous solution may be more reliably obtained and the storage stability of the resist composition becomes satisfactory.

<Other Components>

The resist composition according to the present embodiment may contain, in addition to the aforementioned component (A) and (B), any other components. Examples of the other component include the component (D), the component (E), the component (F), and the component (S) shown below.

[Component (D): Acid Diffusion Control Agent]

The resist composition according to the present embodiment may include an acid diffusion control agent component (hereafter, sometimes referred to as "component (D)"), in addition to the component (A), or in addition to the component (A) and the component (B). The component (D) functions as an acid diffusion control agent, i.e., a quencher which traps the acid generated in the resist composition upon exposure.

The component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

Component (D1)

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions of the resist film, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) functions as a quencher.

[Chemical Formula 39]

(d1-1)

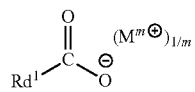

(d1-2)

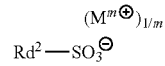

(d1-3)

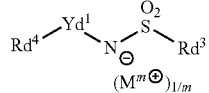

In the formulae, $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; m represents an integer of 1 or more; and each $M^{m+}$ independently represents an organic cation having a valency of m.

{Component (d1-1)}

Anion Moiety

In formula (d1-1), $Rd^1$ represents a cyclic group which may have a substituent, a chain-like alkyl group which may have a substituent or a chain-like alkenyl group which may have a substituent, and is the same groups as those defined above for $R^{101}$ in the aforementioned formula (b-1).

Among these, as the group for $Rd^1$, an aromatic hydrocarbon group which may have a substituent, an aliphatic cyclic group which may have a substituent and a chain-like alkyl group which may have a substituent are preferable. Examples of the substituent for these groups include a hydroxy group, an oxo group, an alkyl group, an aryl group, a fluorine atom, a fluorinated alkyl group, a lactone-containing cyclic group represented by any one of the aforementioned formulae (a2-r-1) to (a2-r-6), an ether bond, an ester bond, and a combination thereof. In the case where an ether bond or an ester bond is contained as a substituent, the substituent may be bonded through an alkylene group.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is particularly desirable.

Specific examples of preferable anion moieties for the component (d1-1) are shown below.

[Chemical Formula 40]

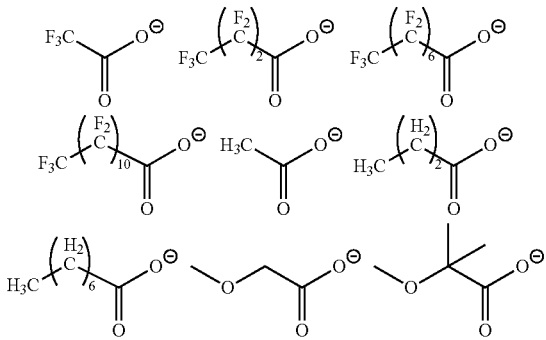

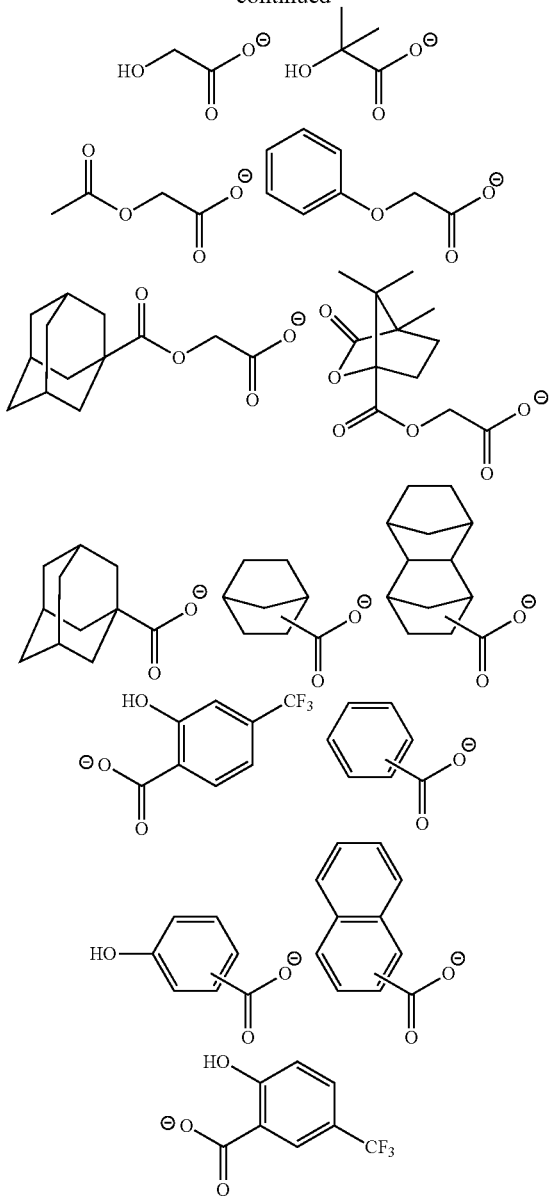

Cation Moiety

In formula (d1-1), $M^{m+}$ represents an organic cation having a valency of m.

As the organic cation for $M^{m+}$, for example, the same cation moieties as those represented by the aforementioned formulae (ca-1) to (ca-4) are preferable, cation moieties represented by the aforementioned general formulae (ca-1) is preferable, and cation moieties represented by the aforementioned formulae (ca-1-1) to (ca-1-67) are still more preferable.

As the component (d1-1), one kind of compound may be used, or two or more kinds of compounds may be used in combination.

{Component (D1-2)}

Anion Moiety

In formula (d1-2), $Rd^2$ represents a cyclic group which may have a substituent, a chain-like alkyl group which may have a substituent or a chain-like alkenyl group which may have a substituent, and is the same groups as those defined above for Y in the aforementioned formula (3).

However, the carbon atom adjacent to the sulfur atom within Rd² group has no fluorine atom bonded thereto (i.e., the carbon atom adjacent to the sulfur atom within Rd2 group does not substituted with a fluorine atom). As a result, the anion of the component (d1-2) becomes an appropriately weak acid anion, thereby improving the quenching ability of the component (D).

As Rd², a chain-like alkyl group which may have a substituent or an aliphatic cyclic group which may have a substituent is preferable. The chain-like alkyl group preferably has 1 to 10 carbon atoms, and more preferably 3 to 10 carbon atoms. As the aliphatic cyclic group, a group in which one or more hydrogen atoms have been removed from adamantane, norbornane, isobornane, tricyclodecane, tetracyclododecane or camphor (which may have a substituent) is more preferable.

The hydrocarbon group for Rd² may have a substituent. As the substituent, the same groups as those described above for substituting the hydrocarbon group (e.g., aromatic hydrocarbon group, aliphatic cyclic group, chain-like alkyl group) for Rd¹ in the formula (d1-1) may be mentioned.

Specific examples of preferable anion moieties for the component (d1-2) are shown below.

[Chemical Formula 41]

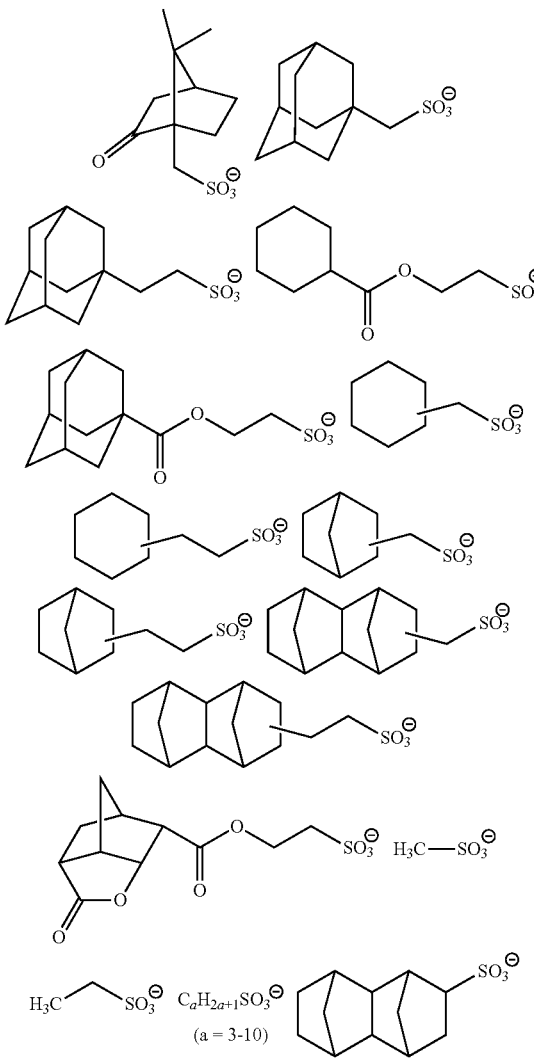
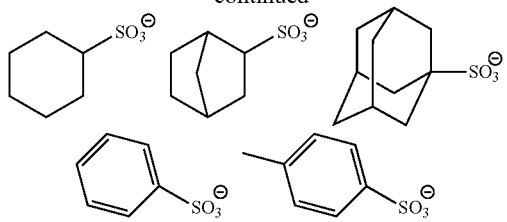

Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

{Component (d1-3)}

Anion Moiety

In formula (d1-3), Rd³ represents a cyclic group which may have a substituent, a chain-like alkyl group which may have a substituent or a chain-like alkenyl group which may have a substituent, and is the same groups as those defined above for Y in the aforementioned formula (3), and a cyclic group containing a fluorine atom, a chain-like alkyl group or a chain-like alkenyl group is preferable. Among these, a fluorinated alkyl group is preferable, and more preferably the same fluorinated alkyl groups as those described above for Rd¹.

In formula (d1-3), Rd⁴ represents a cyclic group which may have a substituent, a chain-like alkyl group which may have a substituent or a chain-like alkenyl group which may have a substituent, and is the same groups as those defined above for Y in the aforementioned formula (3).

Among these, an alkyl group which may have substituent, an alkoxy group which may have substituent, an alkenyl group which may have substituent or a cyclic group which may have substituent is preferable.

The alkyl group for Rd⁴ is preferably a linear or branched alkyl group of 1 to 5 carbon atoms, and specific examples include a methyl group, an ethyl group, an n-propyl group, an isopropyl group, an n-butyl group, an isobutyl group, a tert-butyl group, a pentyl group, an isopentyl group, and a neopentyl group. Part of the hydrogen atoms within the alkyl group for Rd⁴ may be substituted with a hydroxy group, a cyano group or the like.

The alkoxy group for Rd⁴ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

As the alkenyl group for Rd⁴, the same groups as those described above for Y in the aforementioned formula (3) may be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for Rd⁴, the same groups as those described above for Y in the aforementioned formula (3) may be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. In the case where $Rd^4$ is an alicyclic group, the resist composition may be satisfactorily dissolved in an organic solvent, such that the lithography properties are improved. Further, in the case where $Rd^4$ is an aromatic group, in lithography process using EUV or the like as the exposure source, the light absorption efficiency of the resist composition is improved, and the sensitivity and the lithography properties become satisfactory.

In formula (d1-3), $Yd^1$ represents a single bond or a divalent linking group. The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom.

As $Yd^1$, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d1-3) are shown below.

[Chemical Formula 42]

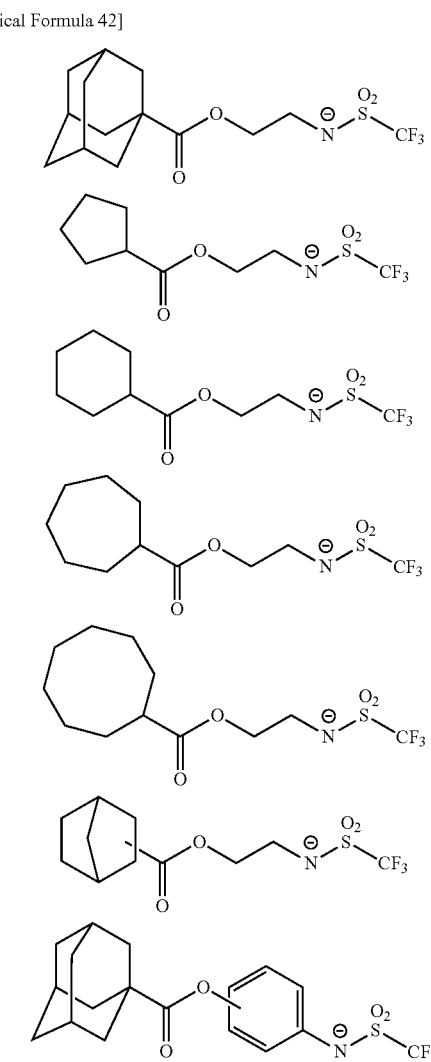

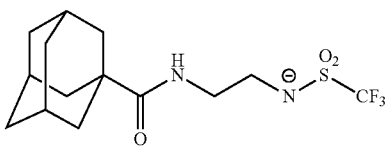

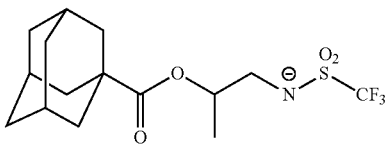

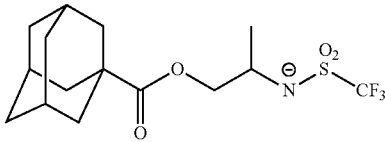

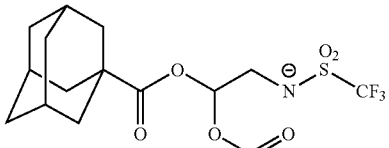

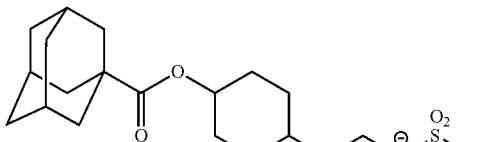

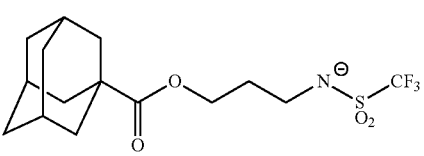

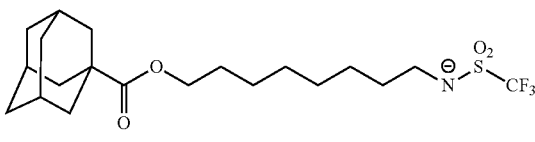

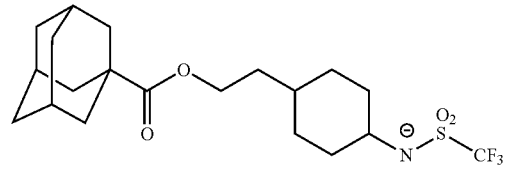

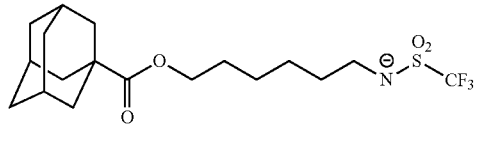

[Chemical Formula 43]

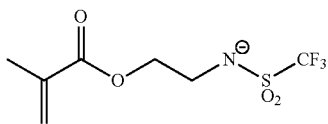

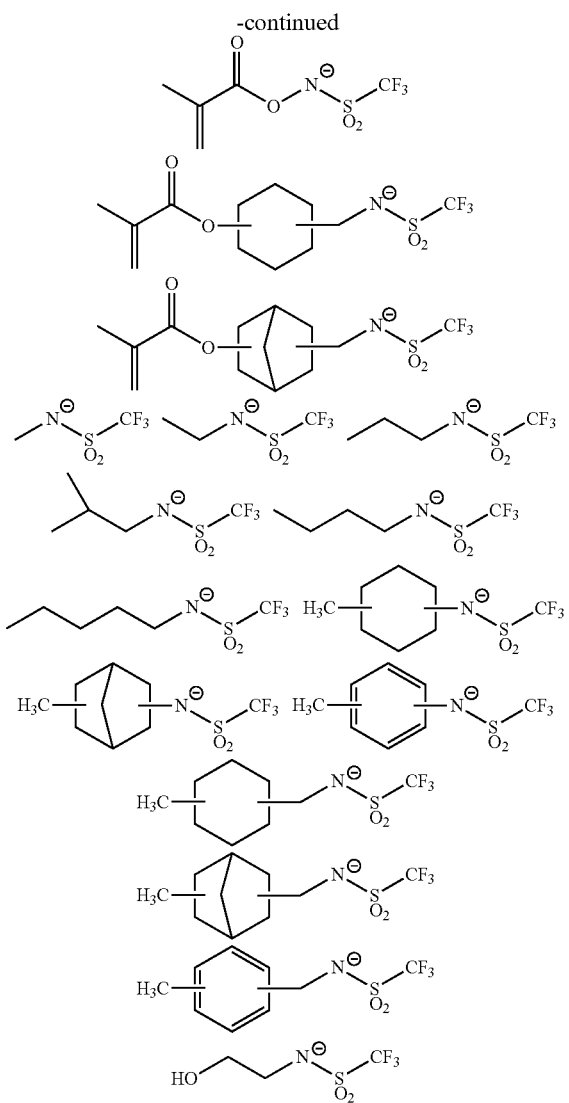

Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3), or at least two types of the aforementioned components (d1-1) to (d1-3) can be used in combination.

Among these examples, as the component (D1), it is preferable to use at least the component (d1-1).

When the resist composition contains the component (D1), the amount of the component (D1) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be more reliably obtained. On the other hand, when the amount of the component (D 1) is no more than the upper limit of the above-mentioned range, sensitivity can be maintained at a satisfactory level, and through-put becomes excellent.

Production Method of Component (D1):

The production methods of the components (d1-1) and (d1-2) are not particularly limited, and the components (d1-1) and (d1-2) can be produced by conventional methods.

Further, the production method of the component (d1-3) is not particularly limited, and the component (d1-3) can be produced in the same manner as disclosed in US2012-0149916.

Component (D2)

The acid diffusion control component may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine is preferable, and a secondary aliphatic amine or tertiary aliphatic amine is more preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group having no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine and triethanolamine triacetate, and triethanolamine triacetate is preferable.

Further, as the component (D2), an aromatic amine may be used.

Examples of aromatic amines include 4-dimethylaminopyridine, pyrrole, indole, pyrazole, imidazole and derivatives thereof, as well as tribenzylamine, 2,6-diisopropylaniline and N-tert-butoxycarbonylpyrrolidine.

As the component (D2), one kind of compound may be used, or two or more kinds of compounds may be used in combination.

When the resist composition contains the component (D2), the amount of the component (D2) is typically used in an amount within a range from 0.01 to 5 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

[Component (E): At Least One Compound Selected from the Group Consisting of Organic Carboxylic Acids, and Phosphorus Oxo Acids and Derivatives Thereof]

In the resist composition of the present embodiment, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof may be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

When the resist composition contains the component (E), the amount of the component (E) is typically used in an amount within a range from 0.01 to 5 parts by weight, relative to 100 parts by weight of the component (A).

[Component (F): Fluorine Additive]

In the present embodiment, the resist composition may further include a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 may be used. Specific examples of the component (F) include polymers having a structural unit (f1) represented by general formula (f1-1) shown below. However, polymeric compounds which fall under the definition of the aforementioned component (A) are excluded.

As the polymer having a structural unit (f1), a polymer (homopolymer) consisting of a structural unit (f1); a copolymer of a structural unit (f1) and a structural unit represented by general formula (m-1) shown below; and a copolymer of a structural unit (f1), a structural unit derived from acrylic acid or methacrylic acid, and a structural unit represented by general formula (m-1) shown below.

As the structural unit represented by general formula (m-1), a structural unit derived from 1-ethyl-1cyclooctyl (meth)acrylate or a structural unit derived from 1-methyl-1-adamantyl (meth)acrylate is preferable.

[Chemical Formula 44]

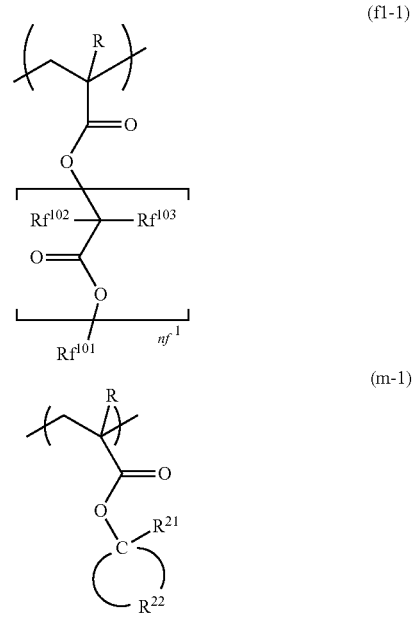

In the formulae, each R independently represents a hydrogen atom, an alkyl group of 1 to 5 carbon atoms or a halogenated alkyl group of 1 to 5 carbon atoms; in formula (f1-1), $Rf^{102}$ and $Rf^{103}$ each independently represents a hydrogen atom, a halogen atom, an alkyl group of 1 to 5 carbon atoms or a halogenated alkyl group of 1 to 5 carbon atoms, provided that $Rf^{102}$ and $Rf^{103}$ may be the same or different; $nf^1$ represents an integer of 0 to 5; $Rf^{101}$ represents an organic group containing a fluorine atom; in formula (m-1), $R^{21}$ represents an alkyl group; $R^{22}$ is a group which forms an aliphatic cyclic group together with a carbon atom having $R^{22}$ bonded thereto;

In formula (f1-1), R represents a hydrogen atom, an alkyl group of 1 to 5 carbon atoms or a halogenated alkyl group of 1 to 5 carbon atoms. In formula (f1-1), R is the same as defined for R in the aforementioned formula (a1-1).

As R, a hydrogen atom, an alkyl group of 1 to 5 carbon atoms or a fluorinated alkyl group of 1 to 5 carbon atoms is preferable, and in terms of industrial availability, a hydrogen atom or an alkyl group of 1 to 5 carbon atoms is more preferable, an alkyl group of 1 to 5 carbon atoms is still more preferable, and a methyl group is still most preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ or $Rf^{103}$ include groups in which part or all of the hydrogen atoms of the aforementioned alkyl groups of 1 to 5 carbon atoms have been substituted with halogen atoms.

Examples of the halogen atom include a fluorine atom, a chlorine atom, a bromine atom and an iodine atom, and a fluorine atom is particularly desirable. Among these examples, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 0 to 5, preferably an integer of 0 to 3, and more preferably 0 or 1.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a trifluoromethyl group, $-CH_2-CF_3$, $-CH_2-CF_2-CF_3$, $-CH(CF_3)_2$, $-CH_2-CH_2-CF_3$, and $-CH_2-CH_2-CF_2-CF_2-CF_2-CF_3$ are most preferable.

In formula (m-1), the alkyl group for $R^{21}$ may be linear, branched or cyclic, and is preferably linear or branched. The linear alkyl group preferably has 1 to 5 carbon atoms, more preferably 1 to 4, and still more preferably 1 or 2. Specific examples include a methyl group, an ethyl group, an n-propyl group, an n-butyl group, and an n-pentyl group. Among these examples, a methyl group, an ethyl group or an n-butyl group is preferable, and a methyl group or an ethyl group is more preferable. The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

In formula (m-1), $R^{22}$ is a group which forms an aliphatic cyclic group together with a carbon atom having $R^{22}$ bonded thereto. The aliphatic cyclic group formed by $R^{22}$ may be polycyclic or monocyclic. As the monocyclic aliphatic hydrocarbon group, a group in which one or more hydrogen atoms have been removed from a monocycloalkane is preferable. The monocycloalkane preferably has 3 to 10 carbon atoms, and examples thereof include cyclopentane, cyclohexane and cyclooctane. As the polycyclic aliphatic hydrocarbon group, a group in which one or more hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the Mw of the component (F) is no more than the upper limit of the above-mentioned range, the resist composition exhibits a satisfactory solubility in a resist solvent. On the other hand, when the Mw is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

When the resist composition contains the component (F), the component (F) is used in an amount within a range from 0.5 to 10 parts by weight, relative to 100 parts by weight of the component (A).

If desired, other miscible additives may also be added to the resist composition of the present embodiment. Examples of such miscible additives include additive resins for improving the performance of the resist film, dissolution inhibitors, plasticizers, stabilizers, colorants, halation prevention agents, and dyes.

[Component (S): Organic Solvent]

The resist composition of the present embodiment may be prepared by dissolving the resist materials for the resist composition in an organic solvent (hereafter, referred to as "component (S)").

The component (S) may be any organic solvent which can dissolve the respective components to give a homogeneous solution, and any organic solvent can be appropriately selected from those which have been conventionally known as solvents for a chemically amplified resist composition.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; dimethylsulfoxide (DMSO); and propylene carbonate.

As the component (S), 1 kind of solvent may be used, or 2 or more solvents may be used as a mixed solvent.

Among these examples, PGMEA, PGME, γ-butyrolactone, EL, cyclohexanone and propylene carbonate are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL or cyclohexanone weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Furthermore, a mixed solvent of PGMEA, PGME and cyclohexanone is also preferable.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate. In general, the component (S) is used in an amount such that the solid content of the resist composition becomes within the range from 1 to 20% by weight, and preferably from 2 to 15% by weight.

In a method of forming a resist pattern using the resist composition according to the present embodiment described above, the effect of improved CDU may be achieved.

<Method of Forming Resist Pattern>

The method of forming a resist pattern according to a second aspect of the present invention includes a step of forming a resist film using the resist composition of the first aspect; a step of exposing the resist film; and a step of developing the resist film to form a resist pattern.

More specifically, the method of forming a resist pattern includes a step of forming a resist film on a substrate using a resist composition which generates acid upon exposure and exhibits changed solubility in a developing solution by the action of acid; a step of exposing the resist film; and a step of patterning the exposed resist film by development using a developing solution to form a resist pattern.

The method for forming a resist pattern may be performed, for example, as follows.

Firstly, a resist composition which generates acid upon exposure and exhibits changed solubility in a developing solution by the action of acid is applied to a substrate using a spinner or the like, and a bake treatment (post applied bake (PAB)) is conducted at a temperature of 80 to 150° C. for 40 to 120 seconds, preferably 60 to 90 seconds, to form a resist film.

As the resist composition, the aforementioned resist composition is used.

Following selective exposure of the thus formed resist film, either by exposure through a mask having a predetermined pattern formed thereon (mask pattern) using an exposure apparatus such an ArF exposure apparatus, an electron beam lithography apparatus or an EUV exposure apparatus, or by patterning via direct irradiation with an electron beam without using a mask pattern.

Then, baking treatment (post exposure baking (PEB)) is conducted under temperature conditions of 80 to 150° C. for 40 to 120 seconds, and preferably 60 to 90 seconds.

Next, the resist film which has been exposed and subjected to baking (PEB) is developed. The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern may be removed by a treatment using a supercritical fluid.

After the developing treatment or the rinse treatment, drying is conducted. If desired, bake treatment (post bake) can be conducted following the developing. In this manner, a resist pattern can be obtained.

By conducting the above operations, a fine resist pattern may be formed.

The substrate is not specifically limited and a conventionally known substrate may be used. For example, substrates for electronic components, and such substrates having wiring patterns formed thereon may be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, F2 excimer laser, extreme ultraviolet rays (EUV), vacuum ultraviolet rays (VUV), electron beam (EB), X-rays, and soft X-rays. The method of forming a resist pattern according to the present embodiment is effective to KrF excimer laser, ArF excimer laser, EB and EUV, and more effective to ArF excimer laser, EB and EUV, and most effective to EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

In an alkali developing process, as the alkali developing solution used in the developing treatment, any conventional alkali developing may be appropriately selected which is capable of dissolving the aforementioned component (A) (component (A) prior to exposure). As an example of the alkali developing solution used in an alkali developing process, a 0.1 to 10% by weight aqueous solution of tetramethylammonium hydroxide (TMAH) may be given.

In a solvent developing process, as the organic solvent contained in the organic developing solution used in the developing treatment, any conventional organic solvent may be appropriately selected which is capable of dissolving the aforementioned component (A) (component (A) prior to exposure). Specific examples of the organic solvent include polar solvents such as ketone solvents, ester solvents, alcohol solvents, nitrile solvents, amide solvents and ether solvents, and hydrocarbon solvents. The developing solution may contain 80% by weight or more of an organic solvent.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxy group in the structure thereof. An "alcoholic hydroxy group" refers to a hydroxy group bonded to a carbon atom of an aliphatic hydrocarbon group. A nitrile solvent is an organic solvent containing a nitrile group in the structure thereof. An amide solvent is an organic solvent containing an amide group within the structure thereof. An ether solvent is an organic solvent containing C—O—C within the structure thereof.

Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent.

A hydrocarbon solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

As the developing solution used in a solvent developing process, in terms of more reliably obtaining a resist pattern with high resolution, it is preferable to contain at least one member selected from the group consisting of an ester organic solvent and a ketone organic solvent, and it is more preferable to contain an ester organic solvent.

Examples of ester organic solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

Among these examples, as an ester solvent, butyl acetate is preferable.

Examples of ketone organic solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone).

Among these examples, as a ketone organic solvent, methyl amyl ketone (2-heptanone) is preferable.

If desired, the organic developing solution may have a conventional additive blended. Examples of the additive include surfactants. The surfactant is not particularly limited, and for example, an ionic or non-ionic fluorine and/or silicon surfactant may be used.

As the surfactant, a non-ionic surfactant is preferable, and a fluorine surfactant or a silicon surfactant is more preferable.

When a surfactant is added to the organic developing solution, the amount thereof based on the total amount of the organic developing solution is generally 0.001 to 5% by weight, preferably 0.005 to 2% by weight, and more preferably 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

As the organic solvent contained in the rinse liquid used in the rinse treatment after the developing in the case of a solvent developing process, any of the aforementioned organic solvents contained in the organic developing solution can be used which hardly dissolves the resist pattern. In general, at least one solvent selected from the group consisting of hydrocarbon organic solvents, ketone organic solvents, ester organic solvents, alcohol organic solvents, amide organic solvents and ether organic solvents is used. Among these, at least one solvent selected from the group consisting of hydrocarbon organic solvents, ketone organic solvents, ester organic solvents, alcohol organic solvents and amide organic solvents is preferable, more preferably at least one solvent selected from the group consisting of ester organic solvents and ketone organic solvents, and most preferably ester organic solvents.

These organic solvents can be used individually, or at least 2 solvents may be mixed together. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the rinse solution may have a conventional additive blended. Examples of the additive include surfactants. As the surfactant, the same surfactants as those described above can be mentioned, and a non-ionic surfactant is preferable, and a fluorine surfactant or a silicon surfactant is more preferable.

When a surfactant is added, the amount thereof based on the total amount of the rinse liquid is generally 0.001 to 5% by weight, preferably 0.005 to 2% by weight, and more preferably 0.01 to 0.5% by weight.

The rinse treatment using a rinse liquid (washing treatment) may be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of substrate (spray method).

EXAMPLES

As follows is a description of examples of the present invention, although the scope of the present invention is by no way limited by these examples.

<Production of Resist Composition>

The components shown in Table 1 were mixed together and dissolved to obtain resist composition of each example. All resist compositions indicated in Tables 1 to 3 had a solid content of 3.1% by weight, and all resist compositions indicated in Table 4 had a solid content of 4.3% by weight.

TABLE 1

| | Component (A) | | | | | | | | |
|---|---|---|---|---|---|---|---|---|---|
| | Polymer | Protection ratio | Component (B) | | Component (D) | Component (E) | Component (F) | Component (S) | |
| Comp. Ex. 1 | Polymer A [100] | 50% | P-A [11.43] | P-B [6.16] | Q-A [6.36] | (E)-1 [0.1] | (F)-1 [0.9] | (S)-1 [3850] | (S)-2 [50] |
| Ex. 1 | Polymer B [100] | 55% | P-A [11.43] | P-B [6.16] | Q-A [6.36] | (E)-1 [0.1] | (F)-1 [0.9] | (S)-1 [3850] | (S)-2 [50] |
| Comp. Ex. 2 | Polymer C [100] | 60% | P-A [11.43] | P-B [6.16] | Q-A [6.36] | (E)-1 [0.1] | (F)-1 [0.9] | (S)-1 [3850] | (S)-2 [50] |

TABLE 2

| | Component (A) | | | | | | | | |
|---|---|---|---|---|---|---|---|---|---|
| | Polymer | Protection ratio | Component (B) | | Component (D) | Component (E) | Component (F) | Component (S) | |
| Comp. Ex. 3 | Polymer I [100] | 50% | P-C [18.7] | P-B [6.16] | Q-A [5.61] | (E)-1 [0.1] | (F)-1 [0.9] | (S)-1 [4060] | (S)-2 [50] |
| Ex. 2 | Polymer J [100] | 55% | P-C [18.7] | P-B [6.16] | Q-A [5.61] | (E)-1 [0.1] | (F)-1 [0.9] | (S)-1 [4060] | (S)-2 [50] |

TABLE 2-continued

| | Component (A) | | | | | | | |
|---|---|---|---|---|---|---|---|---|
| | Polymer | Protection ratio | Component (B) | | Component (D) | Component (E) | Component (F) | Component (S) | |
| Comp. Ex. 4 | Polymer K [100] | 60% | P-C [18.7] | P-B [6.16] | Q-A [5.61] | (E)-1 [0.1] | (F)-1 [0.9] | (S)-1 [4060] | (S)-2 [50] |

TABLE 3

| | Component (A) | | | | | | | |
|---|---|---|---|---|---|---|---|---|
| | Polymer | Protection ratio | Component (B) | | Component (D) | Component (E) | Component (F) | Component (S) | |
| Comp. Ex. 5 | Polymer L [100] | 50% | P-C [18.7] | P-B [6.16] | Q-A [5.61] | (E)-1 [0.1] | (F)-1 [0.9] | (S)-1 [4060] | (S)-2 [50] |
| Ex. 3 | Polymer D [100] | 52.5% | P-C [18.7] | P-B [6.16] | Q-A [5.61] | (E)-1 [0.1] | (F)-1 [0.9] | (S)-1 [4060] | (S)-2 [50] |
| Ex. 4 | Polymer M [100] | 55% | P-C [18.7] | P-B [6.16] | Q-A [5.61] | (E)-1 [0.1] | (F)-1 [0.9] | (S)-1 [4060] | (S)-2 [50] |
| Ex. 5 | Polymer E [100] | 57.5% | P-C [18.7] | P-B [6.16] | Q-A [5.61] | (E)-1 [0.1] | (F)-1 [0.9] | (S)-1 [4060] | (S)-2 [50] |
| Comp. Ex. 6 | Polymer N [100] | 60% | P-C [18.7] | P-B [6.16] | Q-A [5.61] | (E)-1 [0.1] | (F)-1 [0.9] | (S)-1 [4060] | (S)-2 [50] |

TABLE 4

| | Component (A) | | Component (B) | | | Component (D) | Component (E) | Component (F) | Component (S) | |
|---|---|---|---|---|---|---|---|---|---|---|
| | Polymer | Protection ratio | | | | | | | | |
| Comp. Ex. 7 | Polymer F [100] | 50% | P-D [5.15] | P-B [2.85] | — | Q-B [2.99] | (E)-1 [0.1] | (F)-1 [1.25] | (S)-1 [2450] | (S)-2 [50] |
| Ex. 6 | Polymer G [100] | 55% | P-D [5.15] | P-B [2.85] | — | Q-B [2.99] | (E)-1 [0.1] | (F)-1 [1.25] | (S)-1 [2450] | (S)-2 [50] |
| Ex. 7 | Polymer G [100] | 55% | P-D [2.58] | P-B [2.85] | P-E [2.64] | Q-B [2.99] | (E)-1 [0.1] | (F)-1 [1.25] | (S)-1 [2450] | (S)-2 [50] |
| Ex. 8 | Polymer G [100] | 55% | P-D [2.58] | P-E [2.64] | P-F [2.69] | Q-B [2.99] | (E)-1 [0.1] | (F)-1 [1.25] | (S)-1 [2450] | (S)-2 [50] |
| Ex. 9 | Polymer H [100] | 55% | P-D [2.58] | P-B [2.85] | P-E [2.64] | Q-B [2.99] | (E)-1 [0.1] | (F)-1 [1.25] | (S)-1 [2450] | (S)-2 [50] |

In the above tables, the reference characters indicate the following. The values in brackets [ ] indicate the amount (in terms of parts by weight) of the component added.

Polymers A to N: polymers indicated in Table 5

TABLE 5

| | | Compositional ratio of copolymer | | | |
|---|---|---|---|---|---|
| Polymeric compound | Protection ratio (%) | Structural unit | | | Blend ratio of structural unit (molar ratio) |
| | | (a1) | (a2) | (a3) | |
| Polymer A (Mw: 9000) | 50% | (1) | (3) | — | (1)/(3) = 50/50 |
| Polymer B (Mw: 9000) | 55% | (1) | (3) | — | (1)/(3) = 55/45 |
| Polymer C (Mw: 9000) | 60% | (1) | (3) | — | (1)/(3) = 60/40 |
| Polymer D (Mw: 15000) | 52.5% | (1) | (3) | — | (1)/(3) = 52.5/47.5 |
| Polymer E (Mw: 15000) | 57.5% | (1) | (3) | — | (1)/(3) = 57.5/42.5 |
| Polymer F (Mw: 8000) | 50% | (1), (2) | (3), (4) | (6) | (1)/(2)/(3)/(4)/(6) = 20/30/20/20/10 |
| Polymer G (Mw: 8000) | 55% | (1), (2) | (3), (4) | (6) | (1)/(2)/(3)/(4)/(6) = 25/30/20/15/10 |
| Polymer H (Mw: 8000) | 55% | (1), (2) | (4), (5) | (6) | (1)/(2)/(4)/(5)/(6) = 25/30/20/15/10 |
| Polymer I | 50% | Polymer A having weight average molecular weight (Mw) of 12,000 | | | |
| Polymer J | 55% | Polymer B having weight average molecular weight (Mw) of 12,000 | | | |
| Polymer K | 60% | Polymer C having weight average molecular weight (Mw) of 12,000 | | | |
| Polymer L | 50% | Polymer A having weight average molecular weight (Mw) of 15,000 | | | |
| Polymer M | 55% | Polymer B having weight average molecular weight (Mw) of 15,000 | | | |

TABLE 5-continued
| | | Compositional ratio of copolymer | | |
|---|---|---|---|---|
| Polymeric compound | Protection ratio (%) | Structural unit (a1) | (a2) | Blend ratio of structural unit (a3) (molar ratio) |
| Polymer N | 60% | Polymer C having weight average molecular weight (Mw) of 15,000 | | |
[Chemical Formula 45]
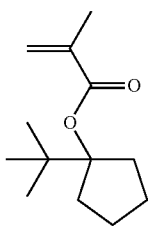
(1)
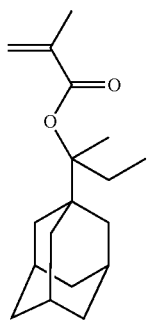
(2)
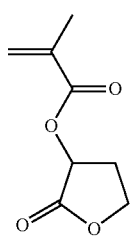
(3)
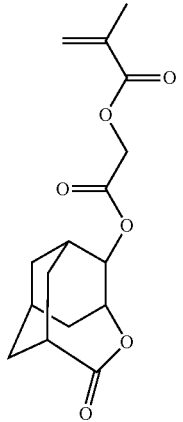
(4)
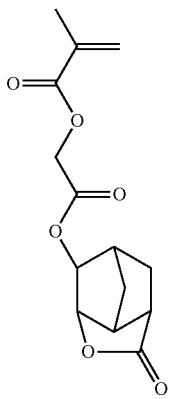
(5)
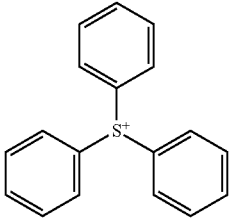
(6)
P-A: Acid-generator component (B) represented by following formula
[Chemical Formula 46]
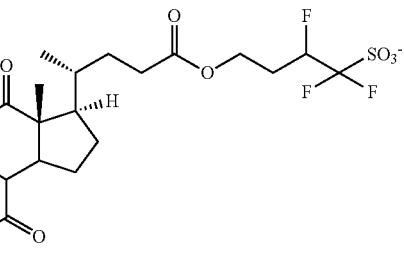

P-B: Acid-generator component (B) represented by following formula

[Chemical Formula 47]

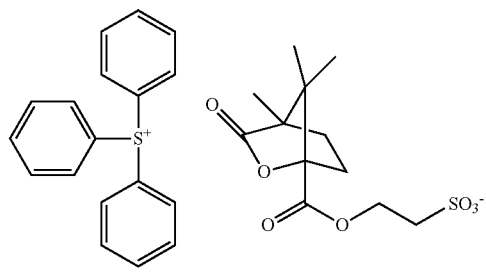

P-C: Acid-generator component (B) represented by following formula

[Chemical Formula 48]

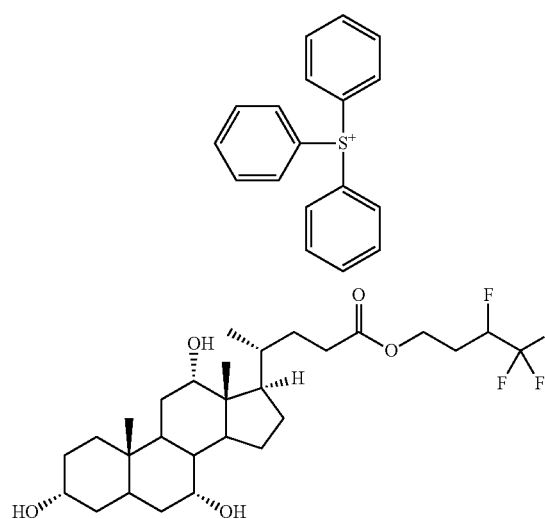

P-D: Acid-generator component (B) represented by following formula

[Chemical Formula 49]

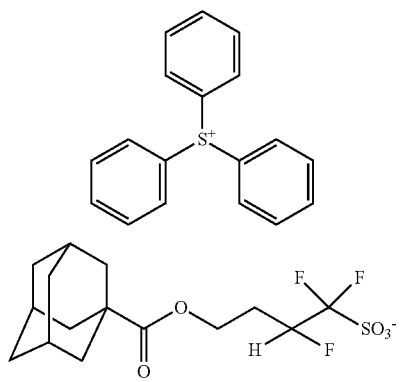

P-E: Acid-generator component (B) represented by following formula

[Chemical Formula 50]

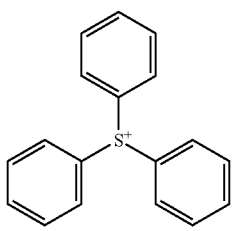

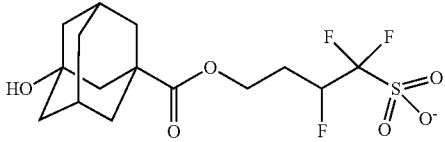

P-F: Acid-generator component (B) represented by following formula

[Chemical Formula 51]

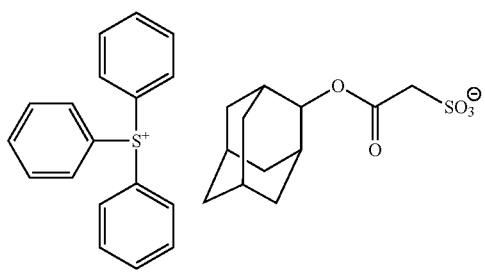

Q-A: Quencher component (D) represented by following formula

[Chemical Formula 52]

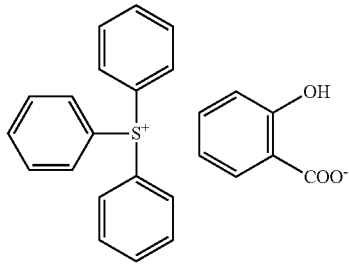

Q-B: Quencher component (D) represented by following formula

[Chemical Formula 53]

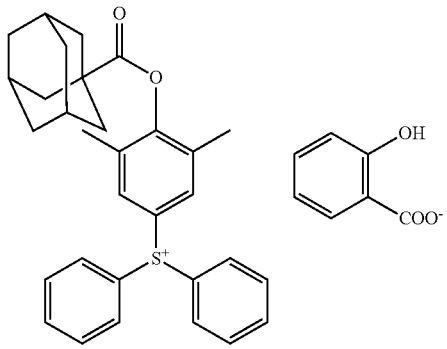

(E)-1: salicylic acid
(F)-1: fluorine-containing polymeric compound represented by following formula. The weight average molecular weight (Mw) and the dispersity (Mw/Mn) in terms of the polystyrene equivalent value measured by gel permeation chromatography (GPC) were 15,000 and 1.61, respectively. The composition of the copolymer (ratio (molar ratio) of the respective structural units within the structural formula) as determined by $^{13}$C-NMR was l/m=50/50.

[Chemical Formula 54]

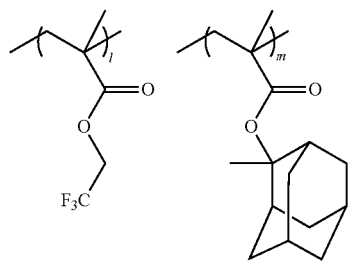

(S)-1: ZX solvent (a mixed solvent of PM (propyleneglycol monomethyletheracetate (PGMEA)) and PE (propyleneglycol monomethylether (PGME)) with a mixing ratio of PM:PE=7:3 (weight ratio))
(S)-2: propylene carbonate <Formation of Negative-Tone Resist Pattern>

Example 1, Comparative Examples 1 and 2

Using a spinner, an organic anti-reflection film composition (product name: ARC95, manufactured by Brewer Science Ltd.) was applied to an 12-inch silicon wafer which had been treated with hexamethyldisilazane (HMDS), and the composition was then baked at 205° C. for 60 seconds and dried, thereby forming an organic anti-reflection film having a film thickness of 98 nm.

Then, each resist composition of Example 1 and Comparative Examples 1 and 2 was applied to the film using a spinner, and was then prebaked (PAB) on a hot plate at a bake temperature of 100° C. for 50 seconds and dried, thereby forming a resist film having a film thickness of 85 nm.

Subsequently, the resist film was selectively irradiated with an ArF excimer laser (193 nm) through a photomask, using an ArF immersion exposure apparatus NSR-S610C (manufactured by Nikon Corporation, NA (numerical aperture)=1.30, Crosspole, 0.98/0.78).

Then, a post exposure bake (PEB) treatment was conducted at 90° C. for 50 seconds.

Next, a solvent development was conducted at 23° C. for 30 seconds using butyl acetate, followed by a rinse treatment.

As a result, a contact hole pattern (hereafter, referred to as "CH pattern") having a hole diameter of 50 nm and a pitch of 90 nm (mask size: 57 nm) was formed.

Examples 2 to 5, Comparative Examples 3 to 6

Using a spinner, an organic anti-reflection film composition (product name: ARC95, manufactured by Brewer Science Ltd.) was applied to an 12-inch silicon wafer which had been treated with hexamethyldisilazane (HMDS), and the composition was then baked at 205° C. for 60 seconds and dried, thereby forming an organic anti-reflection film having a film thickness of 98 nm.

Then, each resist composition of Examples 2 to 5 and Comparative Examples 3 to 6 was applied to the film using a spinner, and was then prebaked (PAB) on a hot plate at a bake temperature of 100° C. for 50 seconds and dried, thereby forming a resist film having a film thickness of 85 nm.

Subsequently, the resist film was selectively irradiated with an ArF excimer laser (193 nm) through a photomask, using an ArF immersion exposure apparatus NSR-S610C (manufactured by Nikon Corporation, NA (numerical aperture)=1.30, Crosspole, 0.98/0.78).

Then, a post exposure bake (PEB) treatment was conducted at 90° C. for 50 seconds.

Next, a solvent development was conducted at 23° C. for 30 seconds using butyl acetate, followed by a rinse treatment.

As a result, a contact hole pattern (hereafter, referred to as "CH pattern") having a hole diameter of 53 nm and a pitch of 100 nm (mask size: 71 nm) was formed.

Examples 6 to 9, Comparative Example 7

An organic anti-reflection film composition (product name: ARC95, manufactured by Brewer Science Ltd.) was applied to an 12-inch silicon wafer using a spinner, and the composition was then baked at 205° C. for 60 seconds and dried, thereby forming an organic anti-reflection film having a film thickness of 98 nm.

Then, each resist composition of Examples 6 to 9 and Comparative Example 7 was applied to the film using a spinner, and was then prebaked (PAB) on a hot plate at a bake temperature of 110° C. for 60 seconds and dried, thereby forming a resist film having a film thickness of 130 nm.

Subsequently, the resist film was selectively irradiated with an ArF excimer laser (193 nm) through a photomask, using an ArF immersion exposure apparatus NSR-S610C (manufactured by Nikon Corporation, NA (numerical aperture)=1.30, Crosspole, 0.98/0.78).

Then, a post exposure bake (PEB) treatment was conducted at 90° C. for 60 seconds.

Next, a solvent development was conducted at 23° C. for 30 seconds using butyl acetate, followed by a rinse treatment.

As a result, a contact hole pattern (hereafter, referred to as "CH pattern") having a hole diameter of 55 nm and a pitch of 160 nm (mask size: 70 nm) and a CH pattern having a hole diameter of 68 nm and a pitch of 160 nm (mask size: 70 nm) were formed.

<Evaluation of Negative-Tone Resist Pattern>
[In-Plane Uniformity (CDU) of Pattern Size]

With respect to each CH pattern obtained in the "Formation of resist pattern", 100 holes in the CH pattern were observed from the upper side thereof using a measuring scanning electron microscope (SEM) (product name: S-9380, manufactured by Hitachi High-Technologies Corporation; acceleration voltage: 300V), and the hole diameter (nm) of each hole was measured. From the results, the value of 3 times the standard deviation (σ) (3σ) was determined. The results are indicated under "CDU (nm)" in Tables 6 to 8.

The smaller the thus determined 3σ value is, the higher the level of the dimension uniformity (CD uniformity) of the holes formed in the resist film.

Example 1, Comparative Examples 1 and 2

The CDU values of Comparative Example 1, Example 1 and Comparative Example 2 are shown in Table 6. Further, the SEM photomicrographs of Comparative Example 1, Example 1 and Comparative Example 2 are shown in FIG. 1 (A) to (C), respectively.

TABLE 6

|  | Protection ratio | CDU 50 nm (nm) | CDU Ave (nm) |
|---|---|---|---|
| Comp. Ex. 1 | 50% | 3.98 | 3.99 |
| Ex. 1 | 55% | 3.86 | 3.93 |
| Comp. Ex. 2 | 60% | 4.04 | 4.05 |

As seen from the results shown above, the resist patterns formed using the resist composition of the present invention exhibited excellent CDU.

Examples 2 to 5, Comparative Examples 3 to 6

Figure 2:
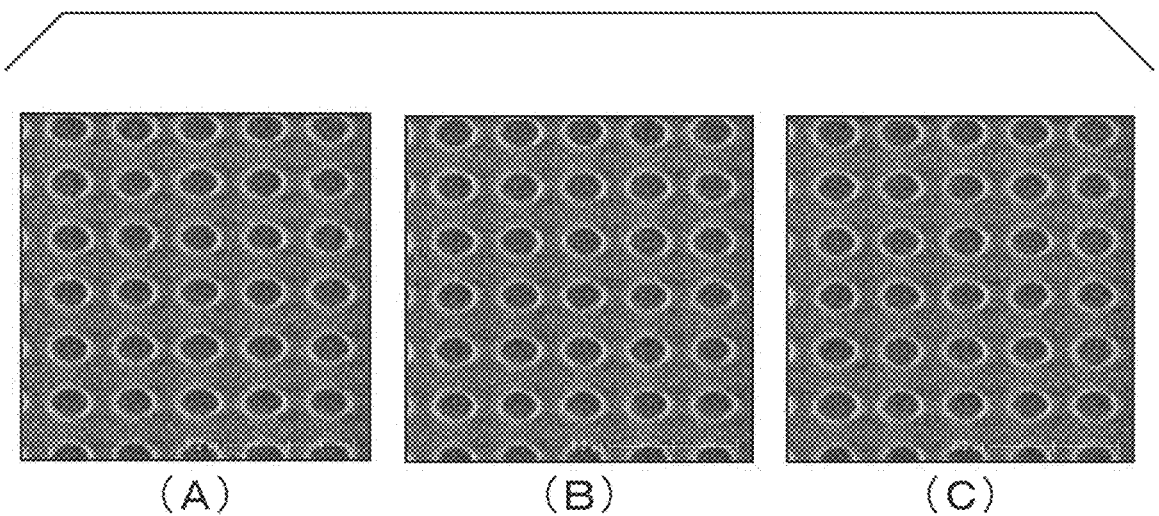
FIG. 2 (A) to (C) are SEM photomicrographs of Comparative Example 3, Example 2 and Comparative Example 4, respectively.

The CDU values of Comparative Example 3, Example 2 and Comparative Example 4 are shown in Table 7. Further, the SEM photomicrographs of Comparative Example 3, Example 2 and Comparative Example 4 are shown in FIG. 2 (A) to (C), respectively.

Figure 3:
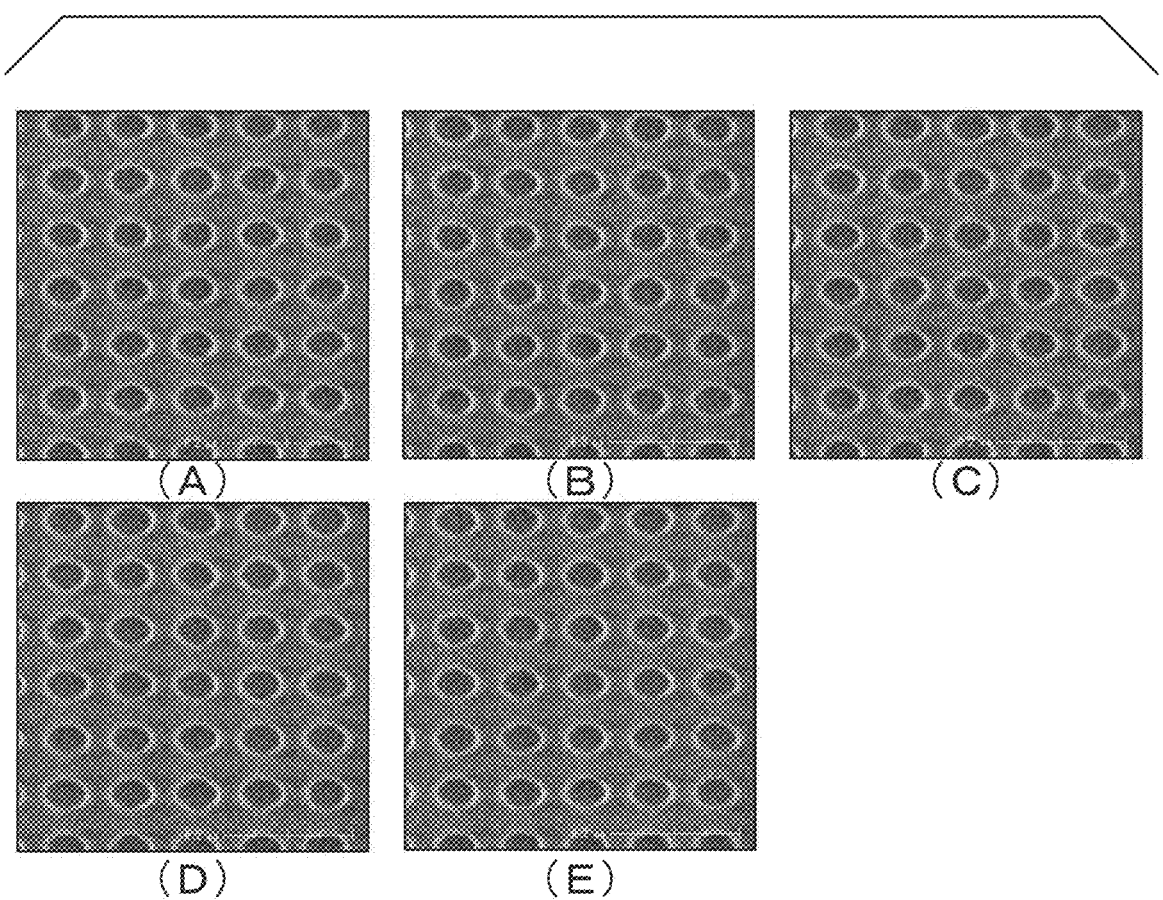
FIG. 3 (A) to (E) are SEM photomicrographs of Comparative Example 5, Examples 3 to 5 and Comparative Example 6, respectively.

The CDU values of Comparative Example 5, Examples 3 to 5 and Comparative Example 6 are shown in Table 8. Further, the SEM photomicrographs of Comparative Example 5, Examples 3 to 5 and Comparative Example 6 are shown in FIG. 3 (A) to (E), respectively.

TABLE 7

|  | Protection ratio | CDU |
|---|---|---|
| Comp. Ex. 3 | 50% | 2.97 |
| Ex. 2 | 55% | 2.85 |
| Comp. Ex. 4 | 60% | 3.04 |

TABLE 8

|  | Protection ratio | CDU |
|---|---|---|
| Comp. Ex. 5 | 50% | 3.01 |
| Ex. 3 | 52.5% | 2.73 |

TABLE 8-continued

|  | Protection ratio | CDU |
|---|---|---|
| Ex. 4 | 55% | 2.78 |
| Ex. 5 | 57.5% | 2.80 |
| Comp. Ex. 6 | 60% | 2.94 |

As seen from the results shown above, the resist patterns formed using the resist composition of the present invention exhibited excellent CDU.

Examples 6 to 9, Comparative Example 7

Figure 4:
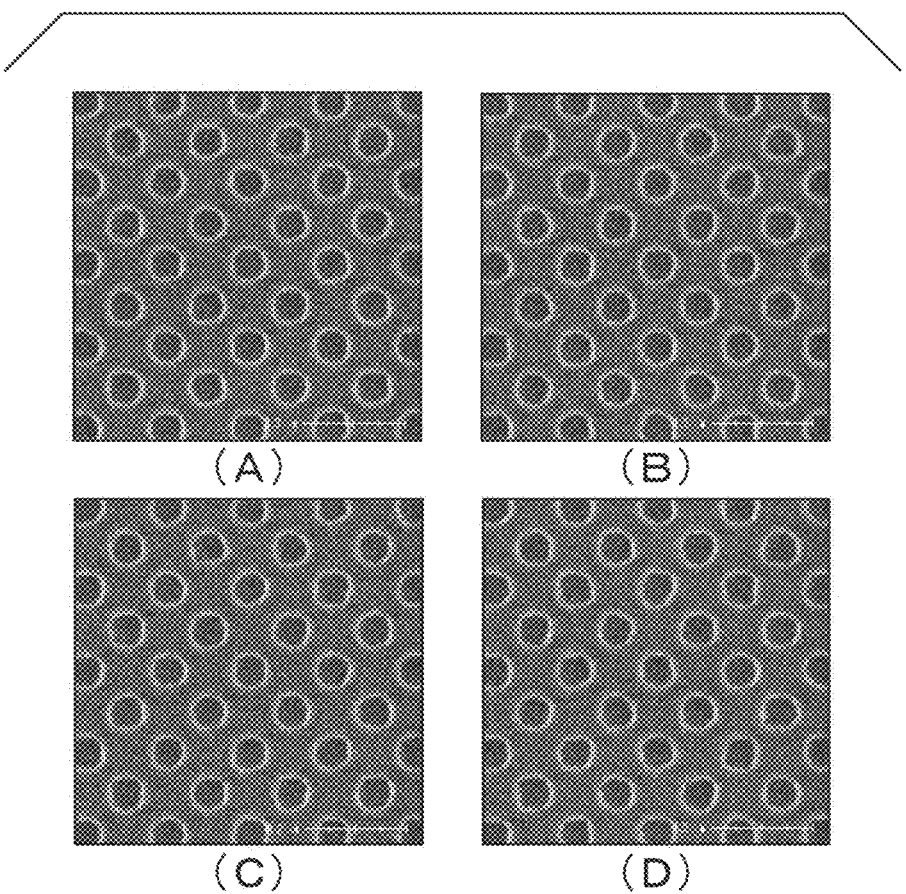
FIG. 4 (A) to (D) are SEM photomicrographs of Examples 6 to 9, respectively.

The CDU values of Comparative Example 7 and Examples 6 to 9 are shown in Table 9. Further, the SEM photomicrographs of Examples 6 to 9 are shown in FIG. 4 (A) to (D), respectively.

TABLE 9

|  | Protection ratio | 55 nm CDU (nm) | 68 nm CDU (nm) |
|---|---|---|---|
| Comp. Ex. 7 | 50% | 4.64 | 10.2 |
| Ex. 6 | 55% | 4.19 | 10.0 |
| Ex. 7 | 55% | 3.91 | 9.46 |
| Ex. 8 | 55% | 4.13 | 8.56 |
| Ex. 9 | 55% | 3.80 | 8.58 |

As seen from the results shown above, the resist patterns formed using the resist composition of the present invention exhibited excellent CDU.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition comprising:
   a base component (A) which exhibits changed solubility in a developing solution under action of acid, and
   an acid-generator component (B) which generates acid upon exposure,
   the base component (A) comprising a polymeric compound (A1) comprising a structural unit (a1) having an acid decomposable group,
   the amount of the structural unit (a1) having an acid decomposable group, based on the combined total of all structural units contained in the polymeric compound (A1) being 51 mol % to 59 mol %, and
   the structural unit (a1) having an acid decomposable group comprising a structural unit represented by general formula (a1-1) shown below:

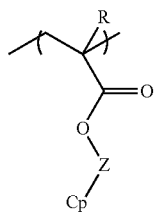
(a1-1)

wherein R represents a hydrogen atom, an alkyl group or a halogenated alkyl group; Z represents a single bond or an alkyl group; and $C_p$ is a group represented by general formula (Cp-1) shown below:

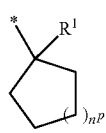
(Cp-1)

wherein $R^1$ represents a tertiary alkyl group; $n_p$ represents a positive integer; and * indicates the bonding position with Z.

2. The resist composition according to claim 1, wherein the polymeric compound (A1) further comprises a structural unit (a2) containing a lactone-containing cyclic group.

3. The resist composition according to claim 1, wherein the polymeric compound (A1) further comprises a structural unit having an acid decomposable group other than the structural unit represented by general formula (a1-1).

4. The resist composition according to claim 1, wherein $n^p$ is 1, and $R^1$ is a tert-butyl group.

5. The resist composition according to claim 1, wherein the amount of the structural unit (a1) having an acid decomposable group, based on the combined total of all structural units contained in the polymeric compound (A1) is 52 mol % to 56 mol %.

6. The resist composition according to claim 2, wherein the structural unit (a2) containing a lactone-containing cyclic group is a structural unit represented by formula (a2-1) shown below:

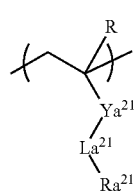
(a2-1)

wherein R represents a hydrogen atom, an alkyl group, a halogenated alkyl group, a hydroxyalkyl group, an alkoxy group; $Ya^{21}$ represents a single bond or a divalent linking group; $La^{21}$ represents —O—, —COO—, —CON(R')—, —OCO—, —CONHCO— or —CONHCS—; and R' represents a hydrogen atom or a methyl group, provided that, when $La^{21}$ represents —O—, $Ya^{21}$ does not represent —CO—; and $Ra^{21}$ is a group selected from the following:

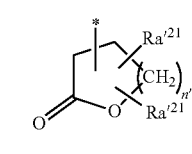
(a2-r-1)

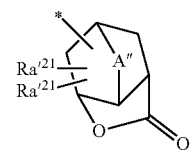
(a2-r-2)

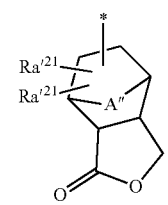
(a2-r-3)

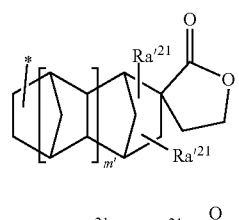
(a2-r-4)

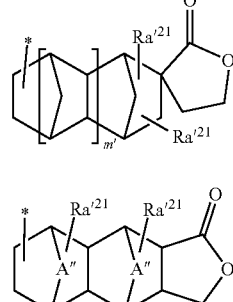
(a2-r-5)

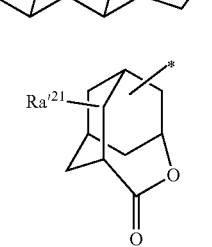
(a2-r-6)

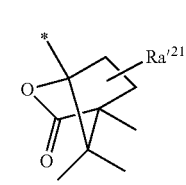
(a2-r-7)

wherein each $Ra'^{21}$ independently represents a hydrogen atom, an alkyl group, an alkoxy group, a halogen atom, a halogenated alkyl group, a hydroxy group, —COOR", —OC(=O)R", a hydroxy alkyl group or a cyano group; R" represents a hydrogen atom or an alkyl group; A" represents an oxygen atom, a sulfur atom or an alkylene group which may contain an oxygen atom or a sulfur atom; n' represents an integer of 0 to 2; and m' represents 0 or 1.

7. The resist composition according to claim 3, wherein the structural unit having an acid decomposable group other than the structural unit represented by general formula (a1-1) is a structural unit represented by formula (a1-2) shown below:

(a1-2)

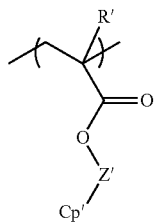

wherein R' represents a hydrogen atom, an alkyl group or a halogenated alkyl group; Z' represents a single bond or an alkyl group; Cp' is a group represented by formula (a1-r-1) or (a1-r-2) shown below:

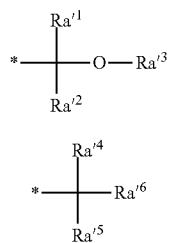

Ra'¹ and Ra'² represents a hydrogen atom or an alkyl group; and Ra'³ represents a hydrocarbon group, provided that Ra'³ may be bonded to Ra'¹ or Ra'²; Ra'⁴ to Ra'⁶ each independently represents a hydrocarbon group, provided that Ra'⁵ and Ra'⁶ may be mutually bonded to form a ring; and * indicates the bonding position.

8. The resist composition according to claim 1, wherein the acid-generator component (B) is an onium salt acid generator, and
   the onium salt acid generator comprises a compound represented by formula (b-1), (b-2) or (b-3) shown below:

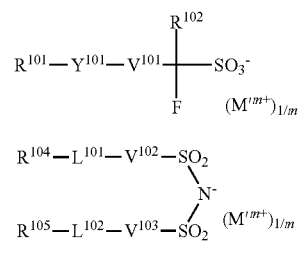

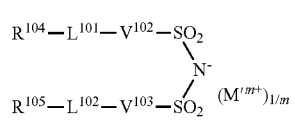

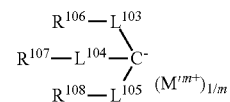

wherein $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO₂—; m represents an integer of 1 or more, and $M'^{m+}$ represents an onium cation having a valency of m.

9. A method of forming a resist pattern, comprising:
forming a resist film on a substrate using the resist composition according to claim 1;
exposing the resist film; and
developing the resist film to form a resist pattern.

* * * * *